(12) United States Patent
Chiu

(10) Patent No.: US 11,664,364 B2
(45) Date of Patent: May 30, 2023

(54) SEMICONDUCTOR DEVICE WITH THROUGH SEMICONDUCTOR VIA AND METHOD FOR FABRICATING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 56 days.

(21) Appl. No.: 17/212,620

(22) Filed: Mar. 25, 2021

(65) Prior Publication Data

US 2022/0310580 A1 Sep. 29, 2022

(51) Int. Cl.
*H01L 25/00* (2006.01)
*H01L 23/00* (2006.01)
(Continued)

(52) U.S. Cl.
CPC ........ *H01L 25/50* (2013.01); *H01L 21/76898* (2013.01); *H01L 24/03* (2013.01);
(Continued)

(58) Field of Classification Search
CPC ... H01L 25/50; H01L 21/76898; H01L 24/03; H01L 24/06; H01L 24/08; H01L 24/83; H01L 24/92; H01L 25/0657; H01L 24/32; H01L 2224/03831; H01L 2224/0384; H01L 2224/05551; H01L 2224/05553; H01L 2224/05556; H01L 2224/0603; H01L 2224/06517; H01L 2224/0801;
(Continued)

(56) References Cited

U.S. PATENT DOCUMENTS

2010/0105169 A1 4/2010 Lee et al.
2012/0248621 A1* 10/2012 Sadaka ................... H01L 25/50
438/455
(Continued)

FOREIGN PATENT DOCUMENTS

TW 202109750 A 3/2021
TW 202119600 A 5/2021
(Continued)

*Primary Examiner* — Jasmine J Clark
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first semiconductor structure, a second semiconductor structure, a through semiconductor via, and an insulation layer. The first semiconductor structure includes a first circuit layer and a first main bonding layer in the first circuit layer and substantially coplanar with a front face of the first circuit layer. The second semiconductor structure includes a second circuit layer on the first circuit layer and a second main bonding layer in the second circuit layer, and topologically aligned with and contacted to the first main bonding layer. The through semiconductor via is along the second semiconductor structure and the first and second main bonding layer, and extending to the first circuit layer. The insulation layer is positioned on a sidewall of the through semiconductor via.

20 Claims, 26 Drawing Sheets

(51) Int. Cl.
*H01L 21/768* (2006.01)
*H01L 25/18* (2023.01)
*H01L 25/065* (2023.01)

(52) U.S. Cl.
CPC .............. *H01L 24/05* (2013.01); *H01L 24/06* (2013.01); *H01L 24/08* (2013.01); *H01L 24/83* (2013.01); *H01L 24/92* (2013.01); *H01L 25/0657* (2013.01); *H01L 25/18* (2013.01); H01L 24/11 (2013.01); H01L 24/13 (2013.01); H01L 24/32 (2013.01); H01L 2224/0384 (2013.01); H01L 2224/03831 (2013.01); H01L 2224/05551 (2013.01); H01L 2224/05553 (2013.01); H01L 2224/05556 (2013.01); H01L 2224/0603 (2013.01); H01L 2224/06517 (2013.01); H01L 2224/0801 (2013.01); H01L 2224/08146 (2013.01); H01L 2224/11849 (2013.01); H01L 2224/13025 (2013.01); H01L 2224/32145 (2013.01); H01L 2224/8013 (2013.01); H01L 2224/8092 (2013.01); H01L 2224/80895 (2013.01); H01L 2224/80951 (2013.01); H01L 2224/8313 (2013.01); H01L 2224/83896 (2013.01); H01L 2224/9202 (2013.01); H01L 2224/9211 (2013.01); H01L 2225/06544 (2013.01)

(58) Field of Classification Search
CPC . H01L 2224/08146; H01L 2224/13025; H01L 2224/32145; H01L 2224/8013; H01L 2224/80895; H01L 2224/8092; H01L 2224/80951; H01L 2224/8313; H01L 2224/83896; H01L 2224/9202; H01L 2224/9211; H01L 2225/06544
See application file for complete search history.

(56) References Cited

U.S. PATENT DOCUMENTS

| | | |
|---|---|---|
| 2015/0140738 A1 | 5/2015 | Moriyama et al. |
| 2016/0155665 A1* | 6/2016 | Kuang ............. H01L 21/76883 438/618 |
| 2017/0154873 A1* | 6/2017 | Kim ........................ H01L 24/73 |
| 2019/0279924 A1 | 9/2019 | Appelt et al. |
| 2021/0305130 A1 | 9/2021 | Cho et al. |

FOREIGN PATENT DOCUMENTS

| | | |
|---|---|---|
| TW | 202133401 A | 9/2021 |
| TW | 202137574 A | 10/2021 |

\* cited by examiner

SEMICONDUCTOR DEVICE WITH THROUGH SEMICONDUCTOR VIA AND METHOD FOR FABRICATING THE SAME

TECHNICAL FIELD

The present disclosure relates to a semiconductor device and a method for fabricating the semiconductor device, and more particularly, to a semiconductor device with a through semiconductor via and a method for fabricating the semiconductor device with the through semiconductor via.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first semiconductor structure, a second semiconductor structure, through semiconductor via, and an insulation layer. The first semiconductor structure includes a first circuit layer positioned on a first substrate, and a first main bonding layer positioned in the first circuit layer. The first main bonding layer is substantially coplanar with a front face of the first circuit layer. The second semiconductor structure includes a second circuit layer positioned on the first circuit layer, a second substrate, and a second main bonding layer. The second substrate is positioned on the second circuit layer. The second main bonding layer is positioned in the second circuit layer. The second main bonding layer and the first main bonding layer are topologically aligned and contacted to each other. The through semiconductor via is positioned along the second semiconductor structure and the first main bonding layer, extending to the first circuit layer, and physically and electrically coupled to a corresponding conductive line in the first circuit layer. The insulation layer is positioned between the second semiconductor structure and the through semiconductor via, between the first main bonding layer and the through semiconductor via, and between the first circuit layer and the through semiconductor via.

In some embodiments, a horizontal cross-sectional area of the through semiconductor via positioned along the second semiconductor structure is greater than a horizontal cross-sectional area of the through semiconductor via positioned along the first main bonding layer.

In some embodiments, a horizontal cross-sectional area of the through semiconductor via positioned along the second substrate is greater than a horizontal cross-sectional area of the through semiconductor via positioned along the second main bonding layer.

In some embodiments, the semiconductor device includes a first sub-bonding layer and a second sub-bonding layer. The first sub-bonding layer is positioned in the first circuit layer and a top surface of the first sub-bonding layer is substantially coplanar with the front face of the first circuit layer, and the second sub-bonding layer is positioned in the second circuit layer and a bottom surface of the second sub-bonding layer is substantially coplanar with the front face of the first circuit layer. The first sub-bonding layer and the second sub-bonding layer are topologically aligned and contacted to each other.

In some embodiments, a horizontal cross-sectional area of the first sub-bonding layer is less than a horizontal cross-sectional area of the first main bonding layer and a horizontal cross-sectional area of the second sub-bonding layer is less than a horizontal cross-sectional area of the second main bonding layer.

In some embodiments, a sidewall of the through semiconductor via positioned along the first main bonding layer is tapered.

In some embodiments, a ratio between the horizontal cross-sectional area of the through semiconductor via positioned along the second semiconductor structure and a horizontal cross-sectional area of the second substrate is between about 2% and about 10%.

In some embodiments, a ratio between the horizontal cross-sectional area of the through semiconductor via positioned along the second semiconductor structure and a horizontal cross-sectional area of the second main bonding layer is between about 30% and about 70%.

In some embodiments, the through semiconductor via is electrically coupled to an external power source.

In some embodiments, the semiconductor device includes a connector positioned on the through semiconductor via.

In some embodiments, a layout of the first circuit layer is different from a layout of the second circuit layer.

In some embodiments, the layout of the first circuit layer and the layout of the second circuit layer are symmetrical.

In some embodiments, a thickness of the first substrate is greater than or equal to a thickness of the second substrate.

In some embodiments, the semiconductor device includes a thermal dissipation layer positioned below the first substrate. The thermal dissipation layer includes vertically oriented graphite and carbon nanotubes.

In some embodiments, the semiconductor device includes an attachment layer positioned between the thermal dissipation layer and the first substrate. The attachment layer includes die attach film, silver paste, or the like.

Another aspect of the present disclosure provides a method for fabricating a semiconductor device including providing a first semiconductor structure, forming a first opening, providing a second semiconductor structure, forming a second opening, flipping the second semiconductor structure, bonding the second circuit layer onto the first circuit layer, forming a via opening, conformally forming an insulation layer on a sidewall of the via opening, and forming a through semiconductor via in the via opening. The first semiconductor structure includes a first circuit layer on a first substrate, and a first main bonding layer in the first circuit layer. The first opening is formed to expose at least partially a corresponding first conductive line in the first circuit layer. The second semiconductor structure includes a second circuit layer on a second substrate, and a second main bonding layer in the second circuit layer. The second opening is formed to expose at least partially the second substrate. The first circuit layer and the second circuit layer are bonded through a hybrid bonding. The first main bonding layer and the second main bonding layer are topologically aligned and physically contacted to each other. The first opening and the second opening are topologically aligned and connected to each other to configure a first space. The via opening is configured by a third opening formed along the second substrate and the first space.

In some embodiments, a horizontal cross-sectional area of the first opening is less than a horizontal cross-sectional area of the second opening.

In some embodiments, a horizontal cross-sectional area of the second main bonding layer is less than a horizontal cross-sectional area of the first main bonding layer after the formation of the first opening and the second opening.

In some embodiments, the step of forming the insulation layer includes conformally forming a layer of insulation material on the sidewall and a bottom surface of the via opening, and removing the layer of insulation material on the bottom surface of the via opening to expose at least partially the corresponding first conductive line and concurrently form the insulation layer on the sidewall of the via opening.

In some embodiments, the method for fabricating the semiconductor device includes a step of performing a thermal annealing process after the bonding of the second circuit layer onto the first circuit layer, wherein a process temperature of the thermal annealing process is between about 25° C. and about 400° C.

Due to the design of the semiconductor device of the present disclosure, the through semiconductor via with low series resistance may be provided. Therefore, the performance of the semiconductor device may be improved. In addition, the first opening and the second opening may reduce the occurrence of defects such as metal dishing. As a result, the yield and quality of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying Out the same purposes of the present disclosure, it should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
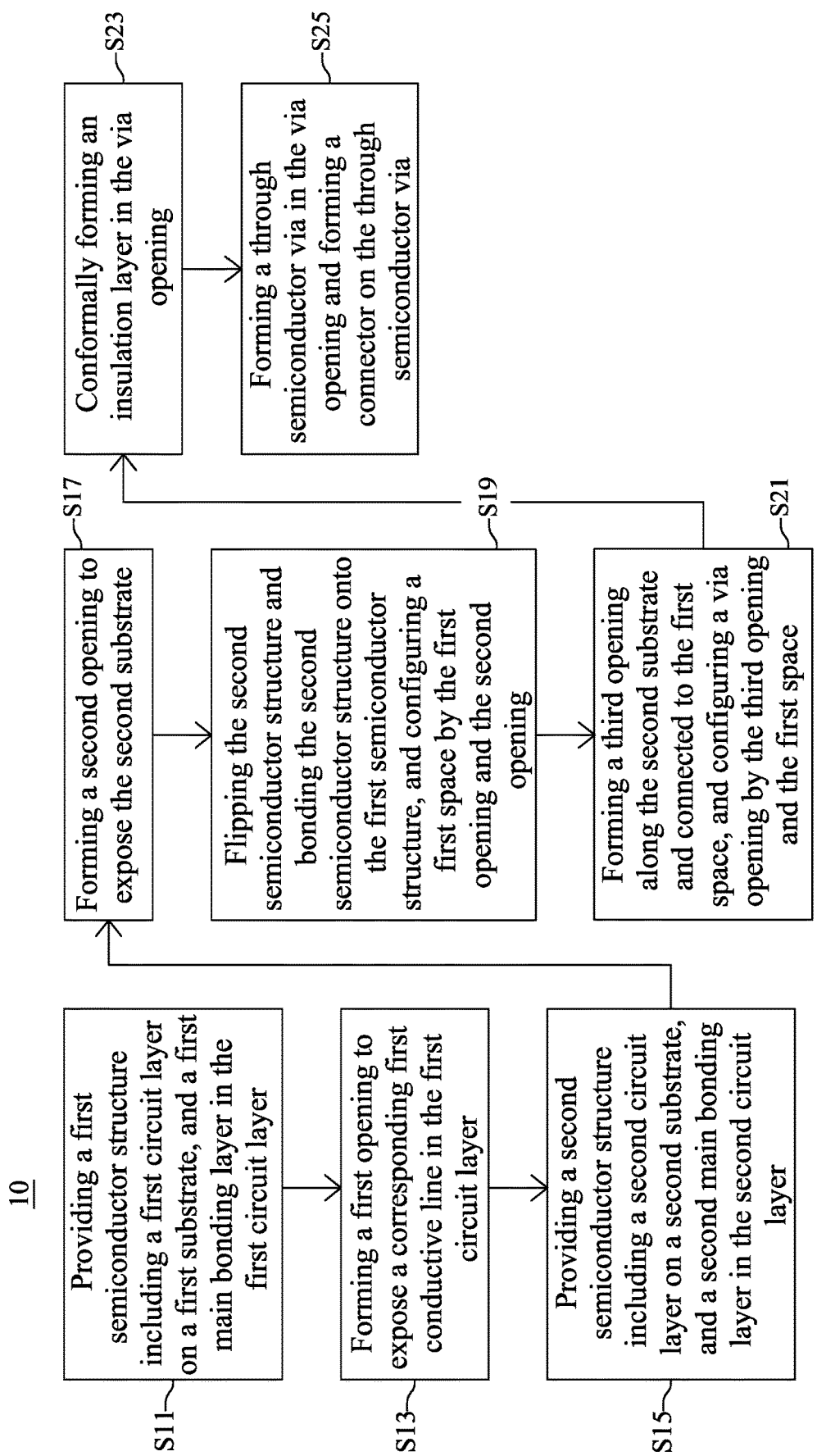
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms, Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, an x-y-z coordinate system is assumed where x and y refer to dimensions within the plane parallel to the major surface of the structure and z refers a dimension perpendicular to the plane.

It should be noted that, in the description of the present disclosure, above (or up) corresponds to the direction of the arrow of the dimension Z, and below (or down) corresponds to the opposite direction of the arrow of the dimension Z.

Figure 2:
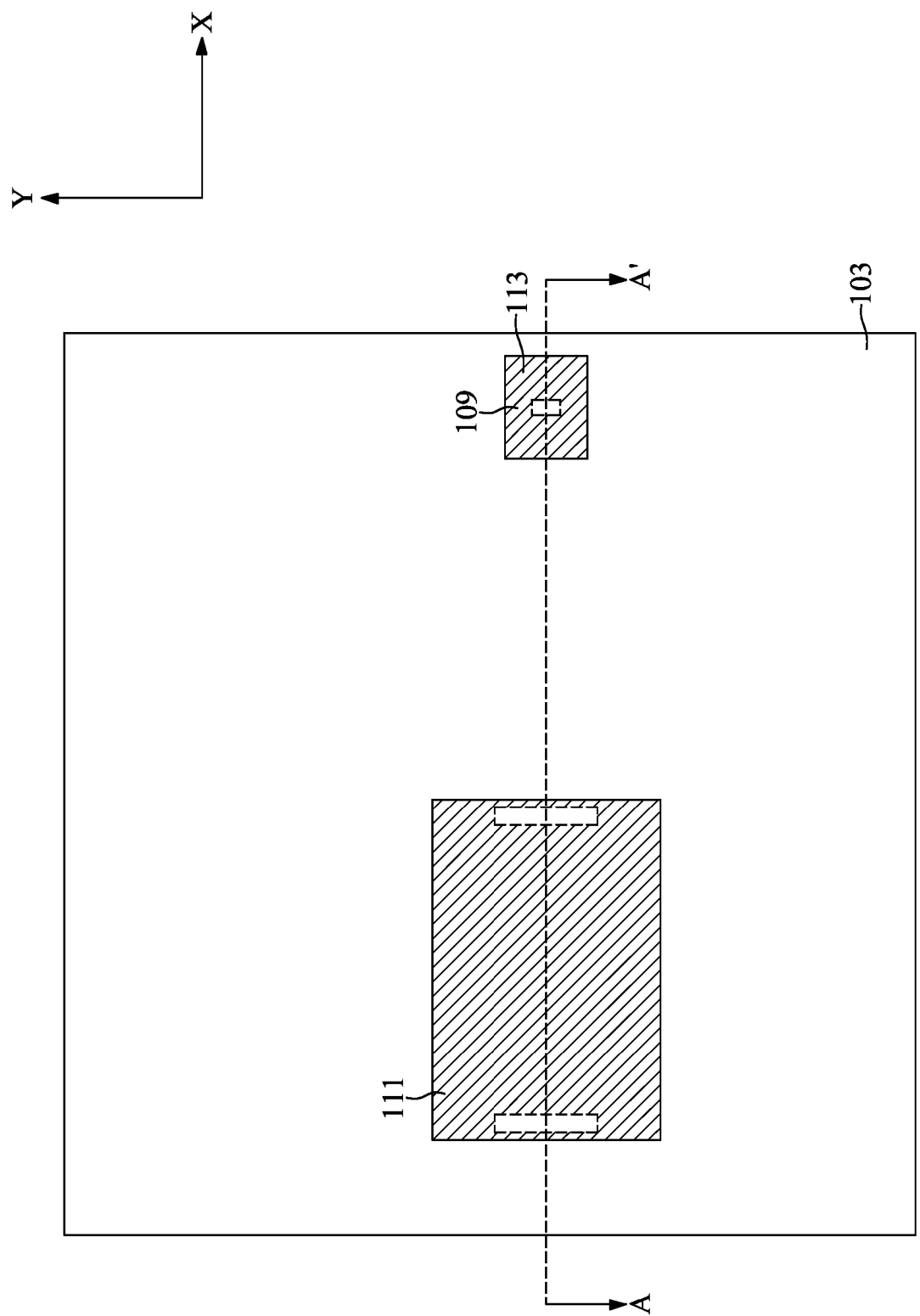
FIG. 2 illustrates, in a schematic top-view diagram, part of a flow for fabricating the semiconductor device in accordance with one embodiment of the present disclosure.
Figure 3:
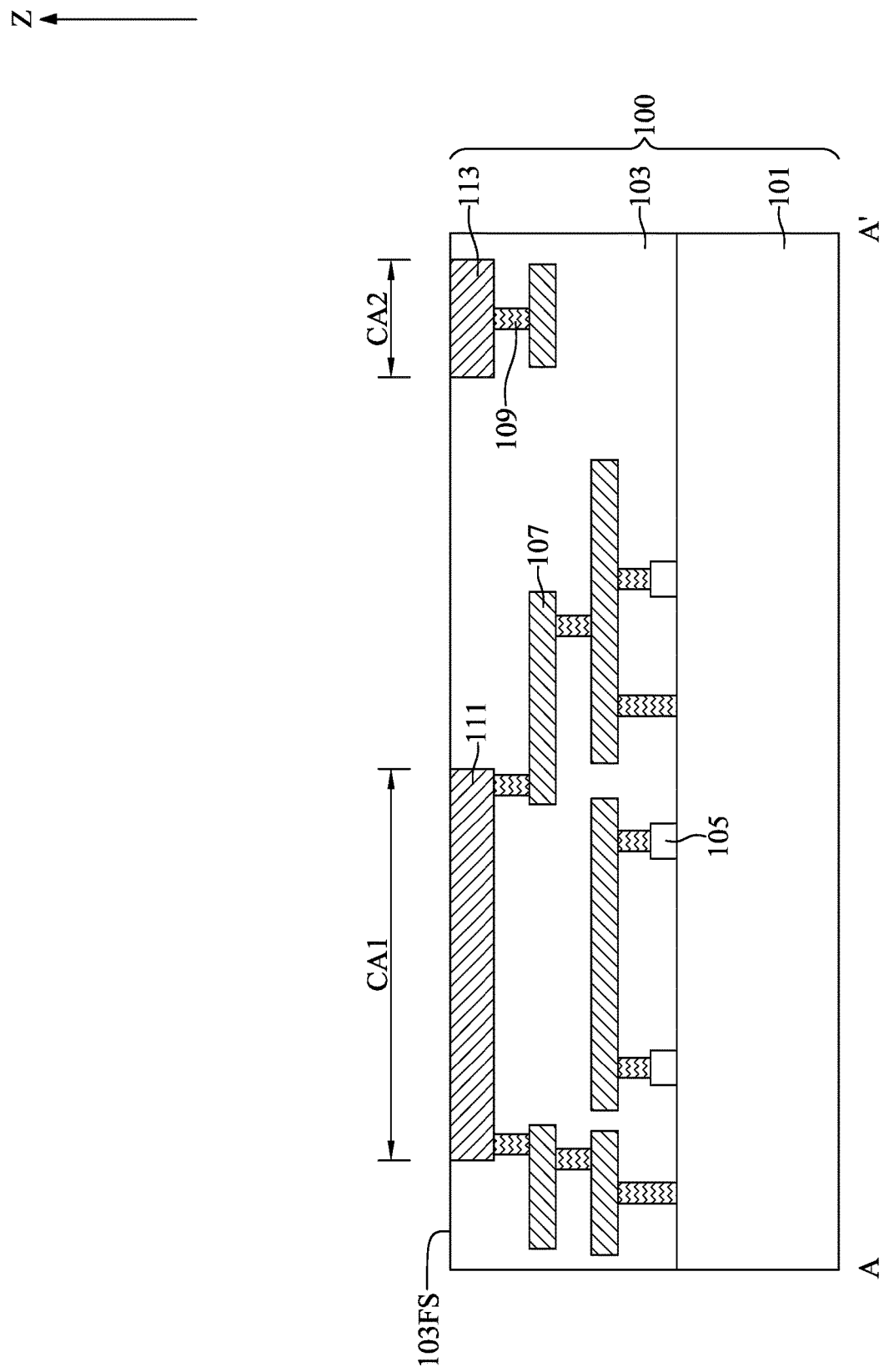
FIG. 3 is a schematic cross-sectional view diagram taken along a line A-A' in FIG. 1.
Figure 4:
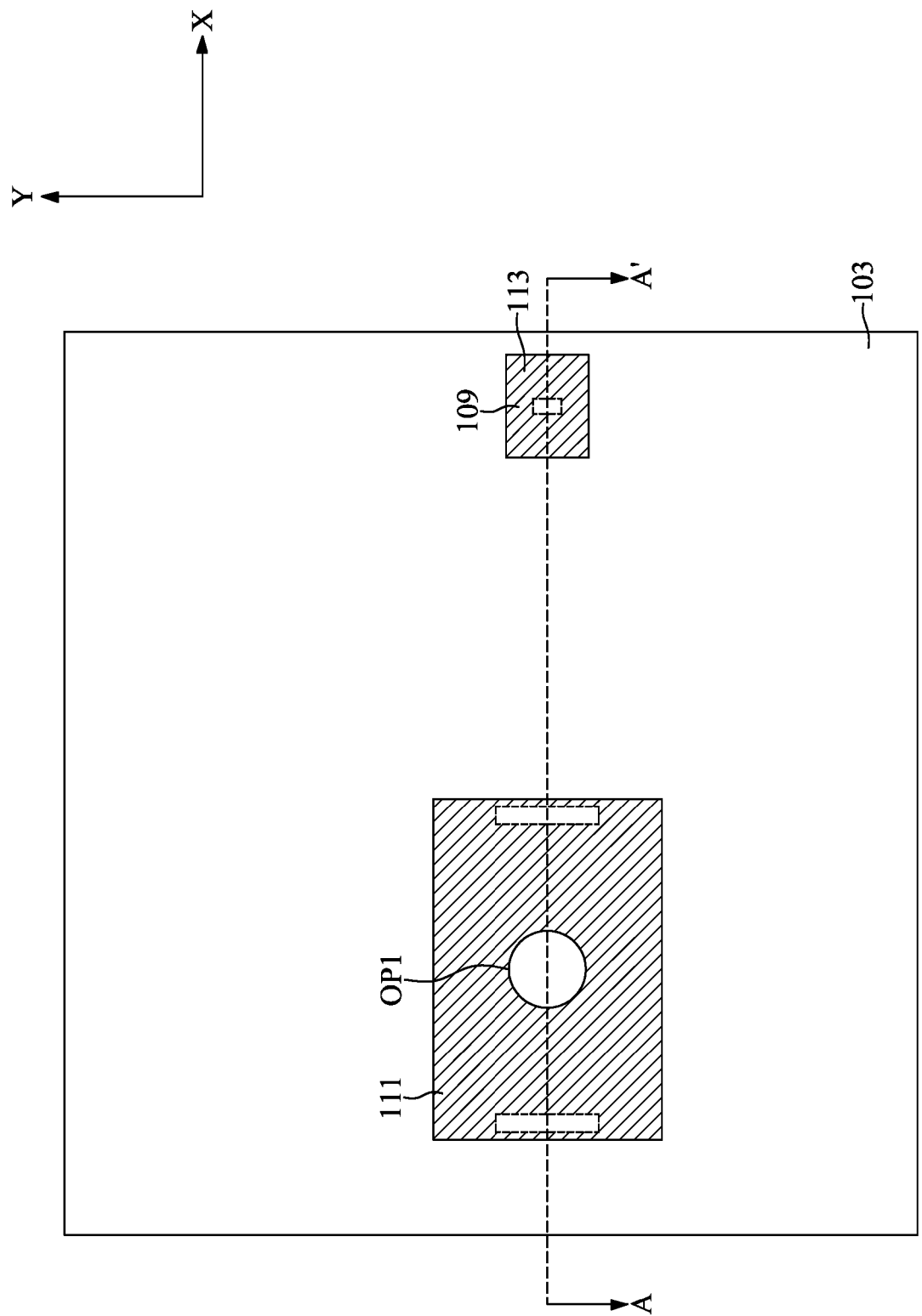
FIG. 4 illustrates, in a schematic top-view diagram, part of the flow for fabricating the semiconductor device in accordance with one embodiment of the present disclosure.
Figure 5:
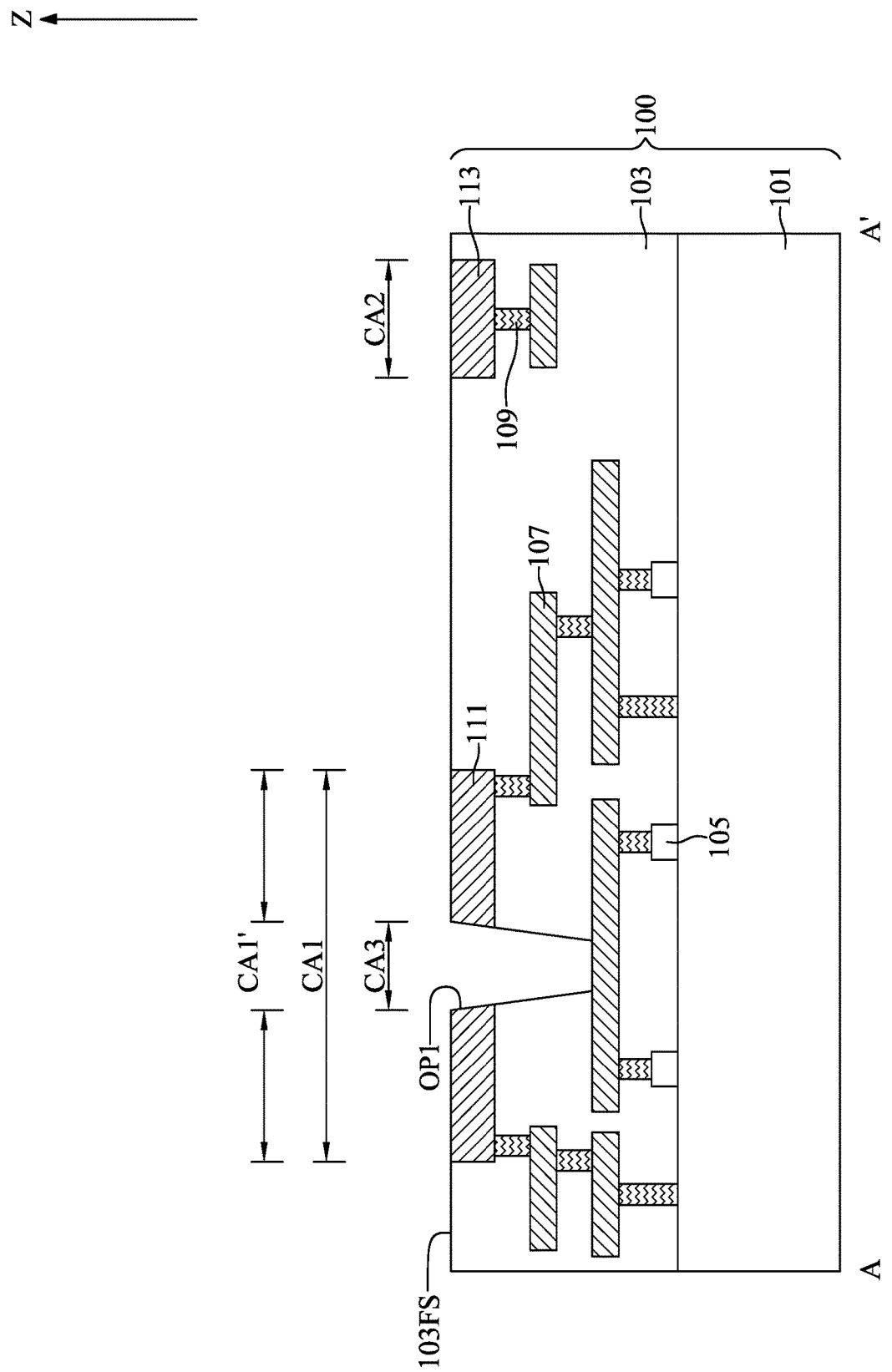
FIG. 5 is a schematic cross-sectional view diagram taken along a line A-A' in FIG. 4.

FIG. 1 illustrates, in a flowchart diagram form, a method 10 for fabricating a semiconductor device 1A in accordance with one embodiment of the present disclosure. FIG. 2 illustrates, in a schematic top-view diagram, part of a flow for fabricating the semiconductor device 1A in accordance with one embodiment of the present disclosure. FIG. 3 is a schematic cross-sectional view diagram taken along a line A-A' in FIG. 1, FIG. 4 illustrates, in a schematic top-view diagram, part of the flow for fabricating the semiconductor device 1A in accordance with one embodiment of the present disclosure. FIG. 5 is a schematic cross-sectional view diagram taken along a line A-A' in FIG. 4.

With reference to FIGS. 1 to 3, at step S11, a first semiconductor structure 100 may be provided and the first semiconductor structure 100 may include a first circuit layer 103 formed on a first substrate 101, and a first main bonding layer 111 formed in the first circuit layer 103.

With reference to FIGS. 2 and 3, the first semiconductor structure 100 may include the first substrate 101, the first circuit layer 103, the first main bonding layer 111, and a first sub-bonding layer 113. The first substrate 101 may include a bulk semiconductor substrate that is composed at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor.

With reference to FIGS. 2 and 3, the first circuit layer 103 may be formed on the first substrate 101. The first circuit layer 103 may include inter-layer dielectric layers and/or inter-metal dielectric layers containing a plurality of first device elements 105 and a plurality of first conductive features. The plurality of first device elements 105 may be transistors such as complementary metal-oxide-semiconductor transistors, metal-oxide-semiconductor field-effect transistors, fin field-effect-transistors, the like, or a combination thereof. The plurality of first conductive features may include a plurality of first conductive lines 107, a plurality of first conductive vias 109, or other suitable conductive elements. The plurality of first conductive features may electrically connect the plurality of first device elements 105, respectively and correspondingly, to form functional units in the first circuit layer 103. A functional unit, in the description of the present disclosure, generally refers to functionally related logic circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex. In the present embodiment, the first semiconductor structure 100 including the plurality of first device elements 105 may be served as a memory.

The inter-layer dielectric layers and/or the inter-metal dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The inter-layer dielectric layers and/or the inter-metal dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps. The plurality of first device elements 105 and the plurality of first conductive features may be formed during the formation of the inter-layer dielectric layers and/or the inter-metal dielectric layers.

The plurality of first conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIGS. 2 and 3, the first main bonding layer 111 and the first sub-bonding layer 113 may be formed in the first circuit layer 103 and electrically coupled to corresponding first conductive lines 107 through corresponding first conductive vias 109. The top surface of the first main bonding layer 111 and the top surface of the first sub-bonding layer 113 may be substantially coplanar with the front surface 103FS of the first circuit layer 103. In some embodiments, the first main bonding layer 111 and the first sub-bonding layer 113 are distal from each other. In some embodiments, the first sub-bonding layer 113 may not electrically couple to any of the plurality of first conductive lines 107. In some embodiments, the first main bonding layer 111 may be designated as a conductive pad. In some embodiments, the first sub-bonding layer 113 may be designated as a conductive pad or a conductive line.

It should be noted that, in the description of the present disclosure, the term "face" or "front" surface is a term of art implying the major surface of the structure upon which is formed device elements and conductive features. Likewise, the "back" surface of a structure is that major surface opposite to the face.

The first main bonding layer 111 and the first sub-bonding layer 113 may be formed of, for example, tungsten, cobalt, zirconium, tantalum, titanium, aluminum, ruthenium, copper, metal carbides, metal nitrides, transition metal aluminides, or a combination thereof.

With reference to FIGS. 2 and 3, the horizontal cross-sectional area CA1 of the first main bonding layer 111 is greater than the horizontal cross-sectional area CA2 of the first sub-bonding layer 113. In some embodiments, a ratio between the horizontal cross-sectional area CA1 of the first main bonding layer 111 and the horizontal cross-sectional area of the first substrate 101 may be between about 8% and about 15%. In some embodiments, a ratio between the horizontal cross-sectional area CA2 of the first sub-bonding layer 113 and the horizontal cross-sectional area of the first substrate 101 may be between about 2% and about 7%. In some embodiments, the first sub-bonding layer 113 may be optional. In other words, no first sub-bonding layer 113 are existed in the first circuit layer 103.

In the description of the present disclosure, a horizontal cross-sectional area indicates that an area of a feature (or element) parallel to the x-y plane. It should be noted that, in a vertical cross-sectional view diagram such as FIG. 3, the horizontal cross-sectional area may only show one dimension e.g., x or y) instead of two dimensions.

It should be noted that the in the description of the present disclosure, the number of the first main bonding layer 111 and the first sub-bonding layer 113 are just for illustration purpose. The number of aforementioned features may be more or less than that shown in FIGS. 2 and 3.

With reference to FIGS. 1, 4, and 5, at step S13, a first opening OP1 may be formed to expose a corresponding first conductive line 107 in the first circuit layer 103.

With reference to FIGS. 4 and 5, the first opening OP1 may be thrilled along the first main bonding layer 111 and extending to the first circuit layer 103 to expose at least partially a top surface of the corresponding first conductive line 107 in the first circuit layer 103. In some embodiments, a ratio between the horizontal cross-sectional area CA3 of the first opening OP1 and the horizontal cross-sectional area CM of the first main bonding layer 111 may be between about 25% and about 65%. In some embodiments, a ratio between the horizontal cross-sectional area CA3 of the first opening OP1 and the horizontal cross-sectional area of the first substrate 101 may be between about 1.5% and about 9.5%. The horizontal cross-sectional area CA1 of the first main bonding layer 111 may be reduced after the formation of the first opening OP1 and is notated as CA1'.

In some embodiments, the sidewall of the first opening OP1 may be tapered. For example, an angle between the sidewall of the first opening OP1 and the top surface of the first main bonding layer 111 may be between about 85 degree and about 88 degree. The first opening OP1 is formed within the region of the first main bonding layer 111; therefore, no extra wafer space is needed to separate the first opening OP1 and the first main bonding layer 111 to reduce effects of misalignment during photolithography process. As a result, the real estate of the semiconductor device 1A may be saved.

Figure 6:
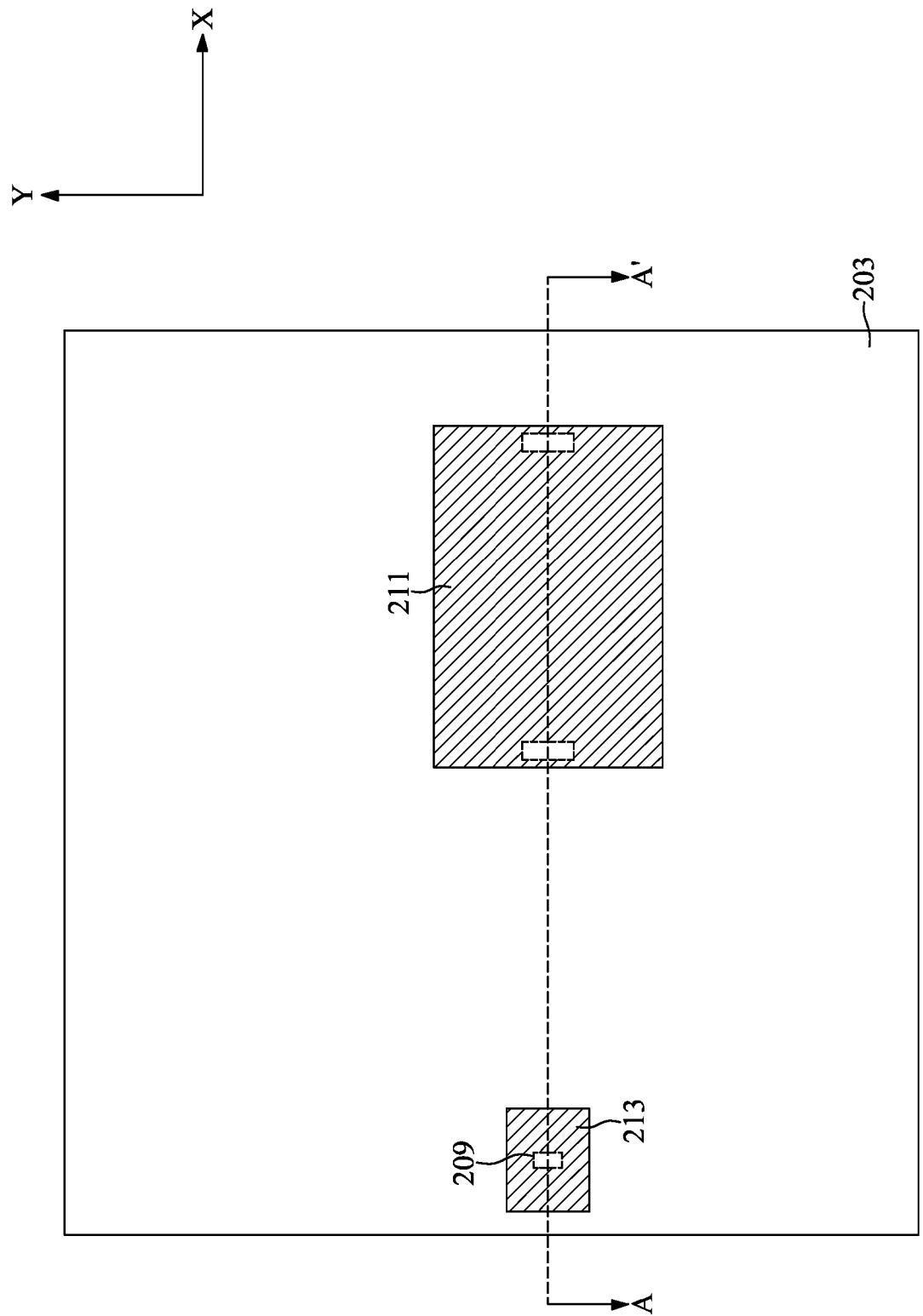
FIG. 6 illustrates, in a schematic top-view diagram, part of the flow for fabricating the semiconductor device in accordance with one embodiment of the present disclosure.
Figure 7:
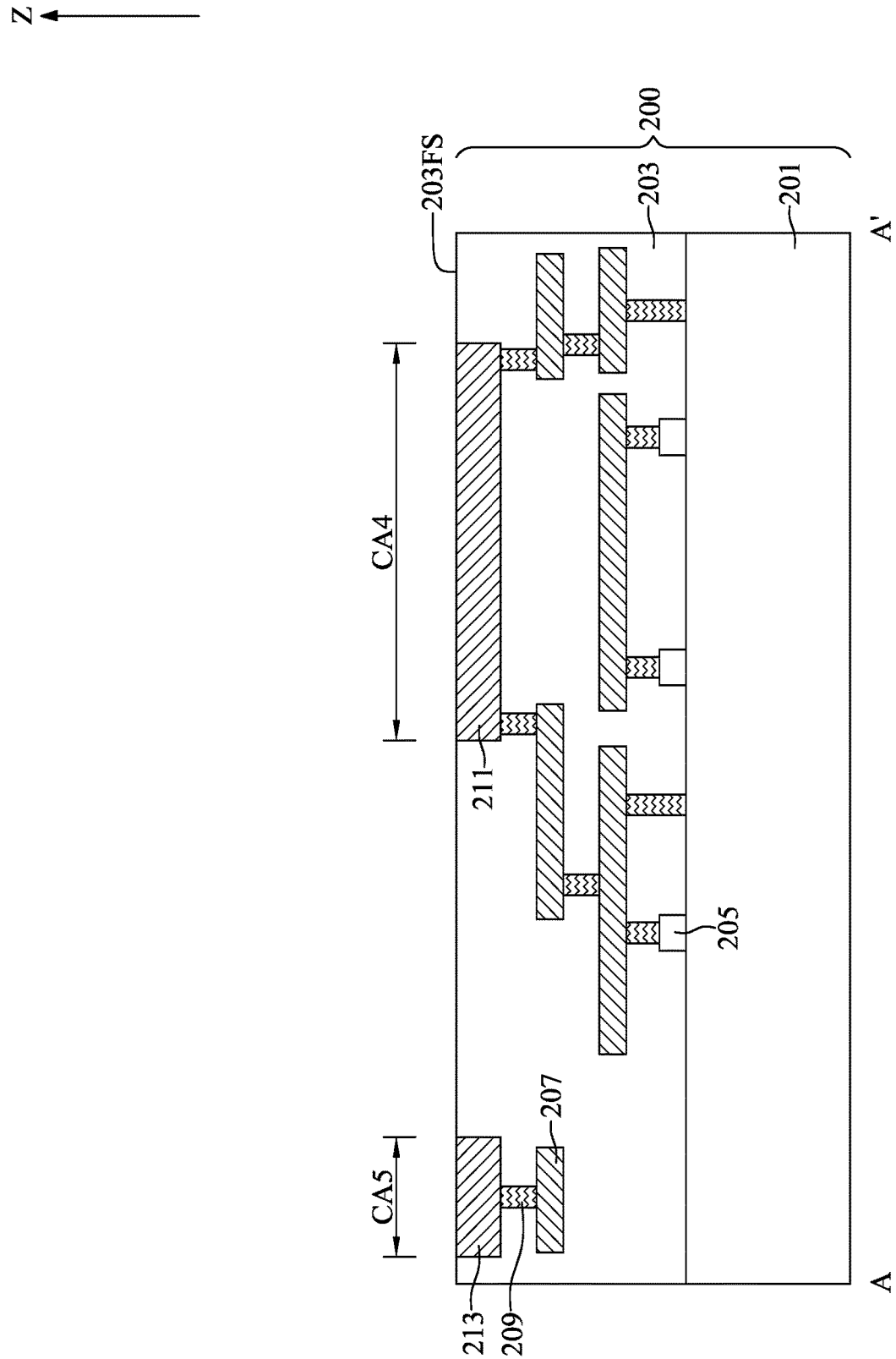
FIG. 7 is a schematic cross-sectional view diagram taken along a line A-A' in FIG. 6.
Figure 8:
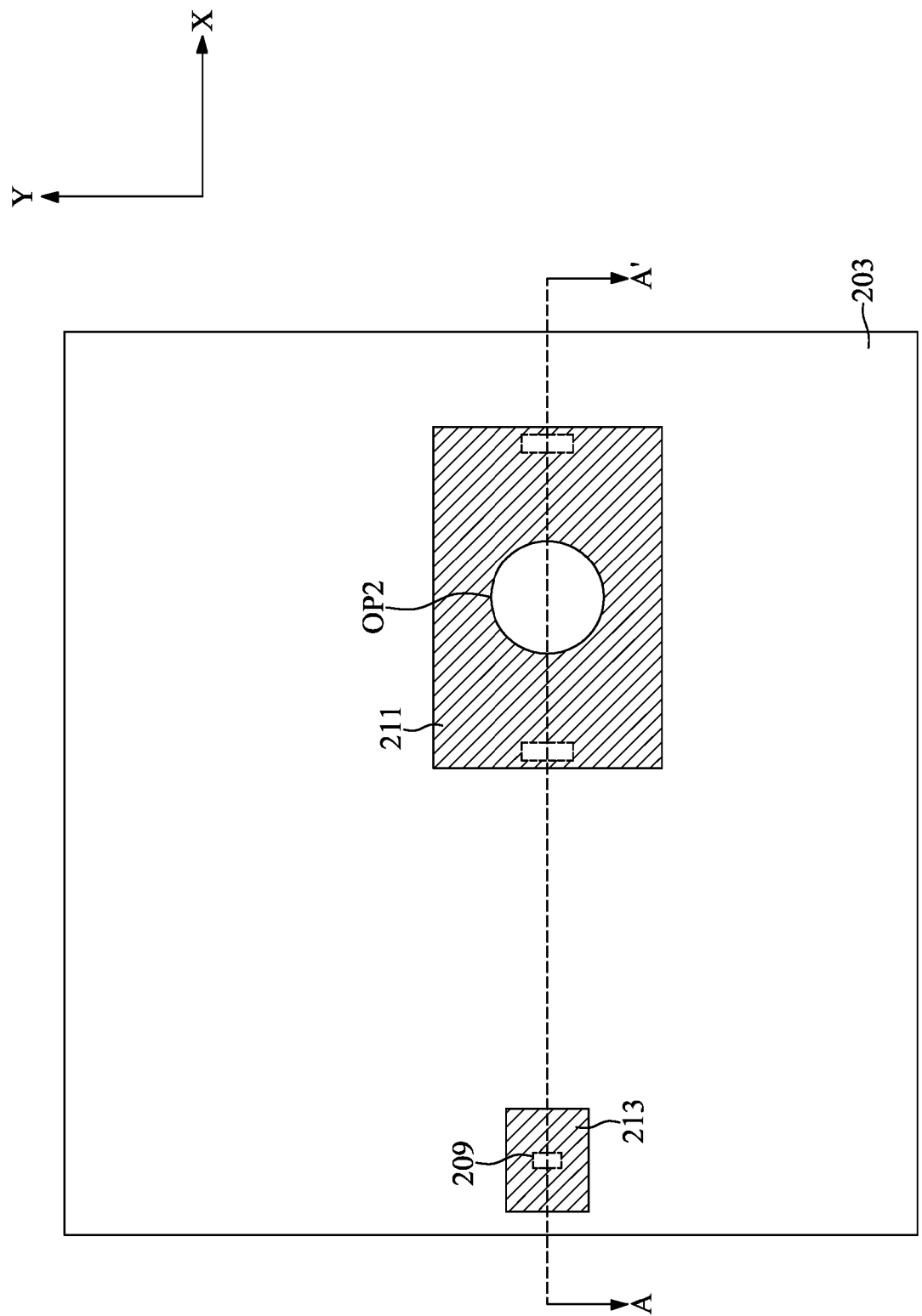
FIG. 8 illustrates, in a schematic top-view diagram, part of the flow for fabricating the semiconductor device in accordance with one embodiment of the present disclosure.
Figure 9:
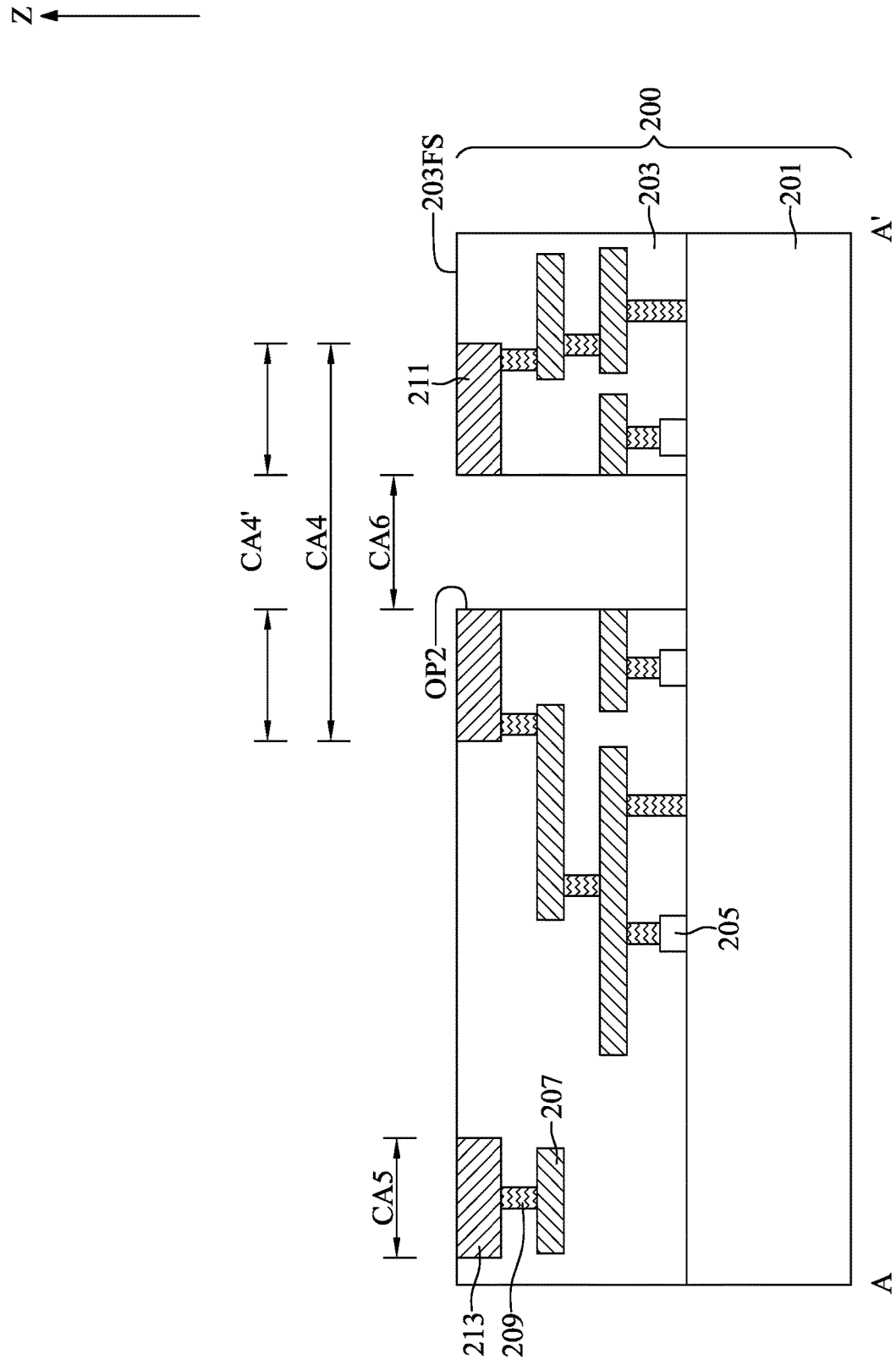
FIG. 9 is a schematic cross-sectional view diagram taken along a line A-A' in FIG. 8.

FIG. 6 illustrates, in a schematic top-view diagram, part of the flow for fabricating the semiconductor device 1A in accordance with one embodiment of the present disclosure. FIG. 7 is a schematic cross-sectional view diagram taken along a line A-A' in FIG. 6. FIG. 8 illustrates, in a schematic top-view diagram, part of the flow for fabricating the semiconductor device 1A in accordance with one embodiment of the present disclosure. FIG. 9 is a schematic cross-sectional view diagram taken along a line A-A' in FIG. 8.

With reference to FIGS. 1, 6, and 7, at step S15, a second semiconductor structure 200 may be provided and the second semiconductor structure 200 may include a second circuit layer 203 formed on a second substrate 201, and a second main bonding layer 211 thrilled in the second circuit layer 203.

With reference to FIGS. 6 and 7, the second semiconductor structure 200 may include the second substrate 201, the second circuit layer 203, the second main bonding layer 211, and a second sub-bonding layer 213. The second substrate 201 may be formed of a same material as the first substrate 101 but is not limited thereto.

With reference to FIGS. 6 and 7, the second circuit layer 203 may be thrilled on the second substrate 201. The second circuit layer 203 may have a similar structure as the first circuit layer 103. For example, the second circuit layer 203 may include inter-layer dielectric layers and/or inter-metal dielectric layers containing a plurality of second device elements 205 and a plurality of second conductive features such as a plurality of second conductive lines 207 and a plurality of second conductive vias 209, or other suitable conductive elements. The plurality of second conductive features may electrically connect the plurality of second device elements 205, respectively and correspondingly, to form functional units in the second circuit layer 203.

In some embodiments, the layout of the first circuit layer 103 and the layout of the second circuit layer 203 are different. For example, the layout of the first circuit layer 103 and the layout of the second circuit layer 203 are symmetrical to each other. For another example, the layout of the second circuit layer 203 may be reflection symmetrical with respect to the layout of the first circuit layer 103. In some embodiments, the first semiconductor structure 100 and the second semiconductor structure 200 may provide a same functionality such as memories. In some embodiments, the first semiconductor structure 100 and the second semiconductor structure 200 may provide different functionalities such as a processor and a memory.

With reference to FIGS. 6 and 7, the second main bonding layer 211 and the second sub-bonding layer 213 may be formed in the second circuit layer 203 and electrically coupled to corresponding second conductive lines 207 through corresponding second conductive vias 209. The top surface of the second main bonding layer 211 and the top surface of the second sub-bonding layer 213 may be substantially coplanar with the front surface 203FS of the second circuit layer 203. In some embodiments, the second main bonding layer 211 and the second sub-bonding layer 213 are distal from each other. In some embodiments, the second sub-bonding layer 213 may not electrically couple to any of the plurality of second conductive lines 207. In some embodiments, the second main bonding layer 211 may be designated as a conductive pad. The second sub-bonding layer 213 may be designated as a conductive pad or a conductive line. The second main bonding layer 211 and the second sub-bonding layer 213 may be thrilled of same materials as the first main bonding layer 111 and the second sub-bonding layer 213, respectively and correspondingly.

With reference to FIGS. 6 and 7, the horizontal cross-sectional area CA4 of the second main bonding layer 211 is greater than the horizontal cross-sectional area CA5 of the second sub-bonding layer 213. In some embodiments, a ratio between the horizontal cross-sectional area CA4 of the second main bonding layer 211 and the horizontal cross-sectional area of the second substrate 201 may be between about 8% and about 15%, In some embodiments, a ratio between the horizontal cross-sectional area CA5 of the second sub-bonding layer 213 and the horizontal cross-sectional area of the second substrate 201 may be between about 2% and about 7%, In some embodiments, the second sub-bonding layer 213 may be optional.

In some embodiments, the horizontal cross-sectional area CA4 of the second main bonding layer 211 may be same as the horizontal cross-sectional area CA1 of the first main bonding layer 111. In some embodiments, the horizontal cross-sectional area CA5 of the second sub-bonding layer 213 may be same as the horizontal cross-sectional area CA2 of the first sub-bonding layer 113. In some embodiments, the horizontal cross-sectional area CA4 of the second main bonding layer 211 may be different from the horizontal cross-sectional area CA1 of the first main bonding layer 111. In some embodiments, the horizontal cross-sectional area CA5 of the second sub-bonding layer 213 may be different from the horizontal cross-sectional area CA2 of the first sub-bonding layer 113.

It should be noted that the in the description of the present disclosure, the number of the second main bonding layer 211 and the second sub-bonding layer 213 are just for illustration purpose. The number of aforementioned features may be more or less than that shown in FIGS. 6 and 7.

With reference to FIGS. 1, 8, and 9, at step S17, a second opening OP2 may be formed to expose the second substrate 201.

With reference to FIGS. 8 and 9, the second opening OP2 may be formed along the second main bonding layer 211 and the second circuit layer 203 to expose at least partially a top surface of the second substrate 201. The second opening OP2 may be formed by, for example, laser drilling, powder blast micromachining, deep reactive ion etching, or wet etching using hydroxides such as potassium hydroxide, sodium hydroxide, rubidium hydroxide, ammonium hydroxide, or tetra methyl ammonium hydroxide.

In some embodiments, a ratio between the horizontal cross-sectional area CA6 of the second opening OP2 and the horizontal cross-sectional area CA4 of the second main bonding layer 211 may be between about 32% and about 72%. In some embodiments, a ratio between the horizontal cross-sectional area CA6 of the second opening OP2 and the horizontal cross-sectional area of the second substrate 201 may be between about 3% and about 11%. The horizontal cross-sectional area CA4 of the second main bonding layer 211 may be reduced after the formation of the second opening OP2 and is notated as CA4'.

In some embodiments, the horizontal cross-sectional area CA6 of the second opening OP2 may be greater than the horizontal cross-sectional area CA3 of the first opening OP1. In some embodiments, the horizontal cross-sectional area CA4' of the second main bonding layer 211 may be less than the horizontal cross-sectional area CA1' of the first main bonding layer 111.

In some embodiments, the sidewall of the second opening OP2 may be substantially vertical. It should be noted that, in the description of the present disclosure, a surface is "substantially vertical" if there exists a vertical plane from which the surface does not deviate by more than three times the root mean square roughness of the surface.

The second opening OP2 is formed within the region of the second main bonding layer 211; therefore, no extra wafer space is needed to separate the second opening OP2 and the second main bonding layer 211 to reduce effects of misalignment during photolithography process. As a result, the real estate of the semiconductor device 1A may be saved.

FIGS. 10 to 18 illustrate, in schematic cross-sectional view diagrams, part of the flow for fabricating the semiconductor device 1A in accordance with one embodiment of the present disclosure. FIG. 19 illustrates, in a schematic close-up cross-sectional view diagram, an intermediate semiconductor device in accordance with one embodiment of the present disclosure.

With reference to FIG. 1 and FIGS. 10 to 12, at step S19, the second semiconductor structure 200 may be flipped and may be bonded onto the first semiconductor structure 100, and the first opening OP1 and the second opening OP2 together configure a first space SP1.

Figure 10:
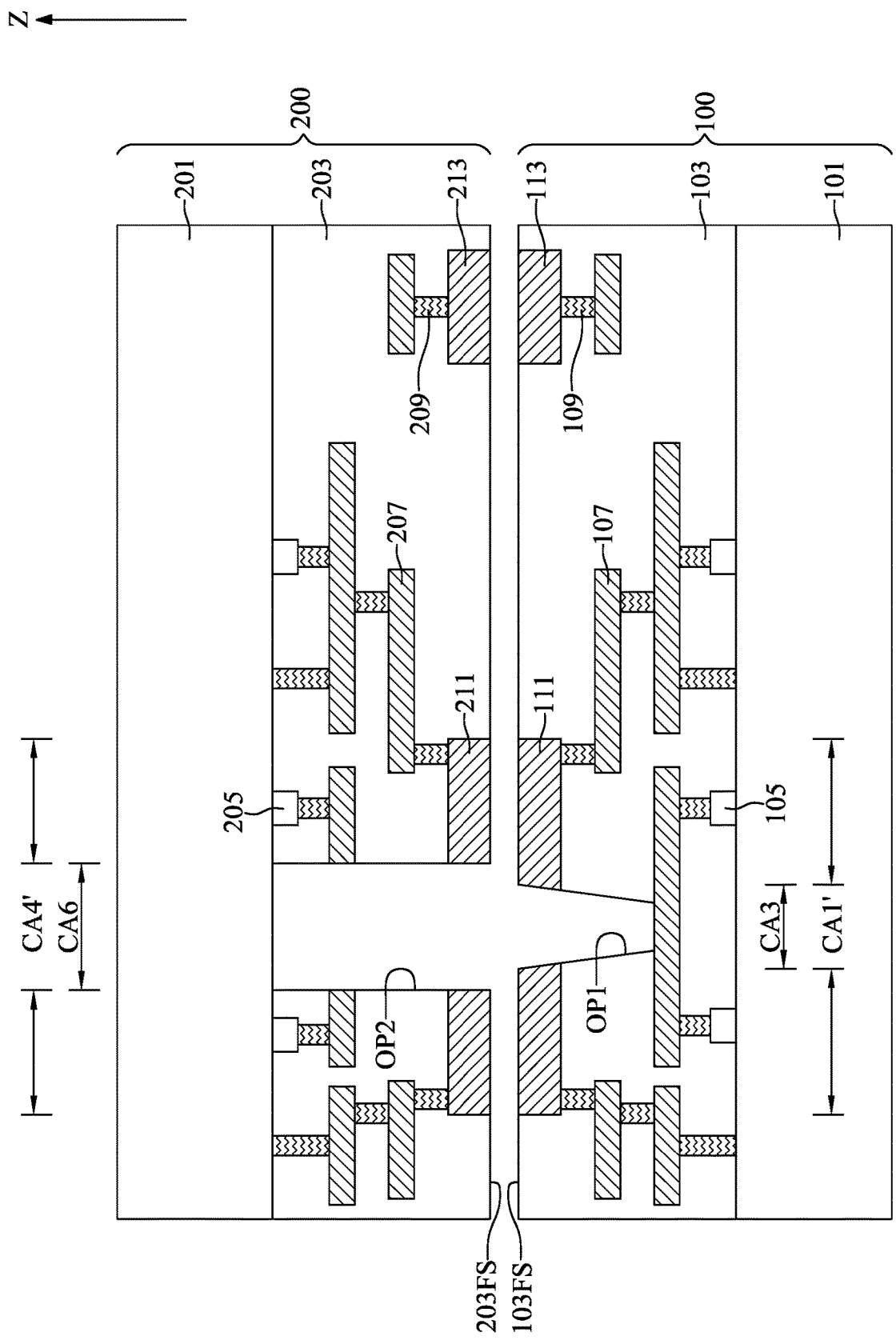
FIGS. 10 to 18 illustrate, in schematic cross-sectional view diagrams, part of the flow for fabricating the semiconductor device in accordance with one embodiment of the present disclosure.

With reference to FIG. 10, after the second semiconductor structure 200 is flipped, the first main bonding layer 111 and the second main bonding layer 211 may be topologically aligned, the first sub-bonding layer 113 and the second sub-bonding layer 213 may be topologically aligned, and the first opening OP1 and the second opening OP2 may be topologically aligned. It should be noted that, in the description of the present disclosure, two features are topographically aligned when those features have substantially the same x, y coordinates.

Figure 11:
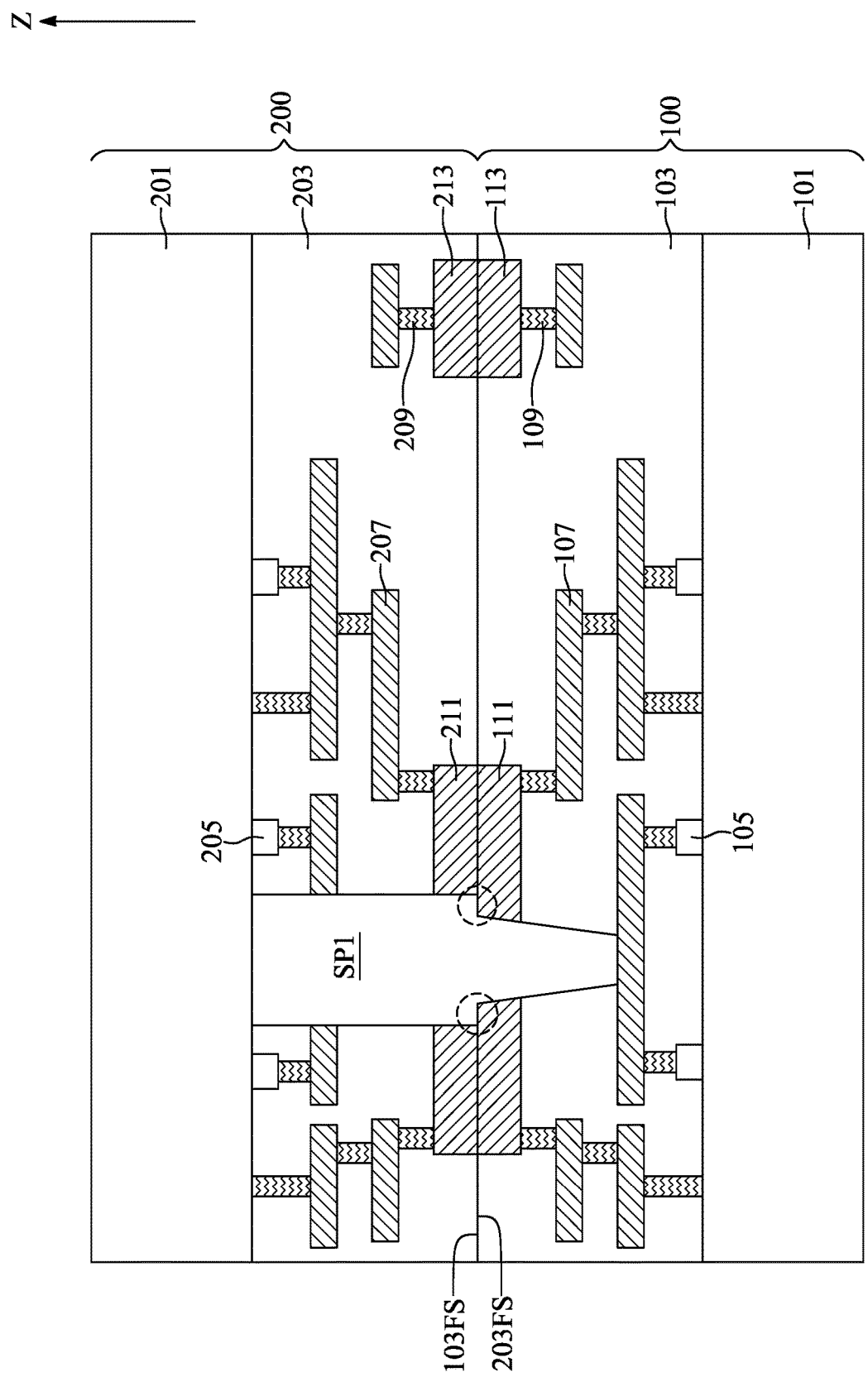

With reference to FIG. 11, the second circuit layer 203 may be bonded onto the first circuit layer 103 in a face-to-face configuration through a hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to short the time consuming of the hybrid bonding process.

In some embodiments, the hybrid bonding process may include activating front faces 103FS, 203FS of the first circuit layer 103 and the second circuit layer 203 (e.g., in a plasma process), cleaning the first circuit layer 103 and the second circuit layer 203 after activation, contacting the activated front surfaces 103FS, 203FS of the first circuit layer 103 and the second circuit layer 203, and performing a thermal annealing process to strengthen the bonding between the first circuit layer 103 and the second circuit layer 203.

In some embodiments, the hybrid bonding process may include dielectric-to-dielectric bonding, metal-to-metal bonding, and metal-to-dielectric bonding. The dielectric-to-dielectric bonding may originate from the bonding between the dielectric layers of the first circuit layer 103 and the dielectric layers of the second circuit layer 203. The metal-to-metal bonding may originate from the bonding between the first main bonding layer 111 and the second main bonding layer 211, and between the first sub-bonding layer 113 and the second sub-bonding layer 213. The metal-to-dielectric bonding may originate from the bonding between the dielectric layers of the first circuit layer 103 and the second main bonding layer 211, between the dielectric layers of the first circuit layer 103 and the second sub-bonding layer 213, between the dielectric layers of the second circuit layer 203 and the first main bonding layer 111, or between the dielectric layers of the second circuit layer 203 and the first sub-bonding layer 113.

In some embodiments, when the dielectric layers of the first circuit layer 103 and the dielectric layers of the second circuit layer 203 are formed of, for example, silicon oxide or silicon nitride, the bonding between the dielectric layers of the first circuit layer 103 and the dielectric layers of the second circuit layer 203 may be based on the hydrophilic bonding mechanism. Hydrophilic surface modifications may be applied to the dielectric layers of the first circuit layer 103 and the dielectric layers of the second circuit layer 203 before bonding.

In some embodiments, a thermal annealing process may be performed after the bonding process to enhance dielectric-to-dielectric bonding and to induce thermal expansion of metal-to-metal bonding so as to further improve the bonding quality.

Due to the horizontal cross-sectional area CA1' of the first main bonding layer 111 and the horizontal cross-sectional area CA4' of the second main bonding layer 211 are reduced after formation of the first opening OP1 and the second opening OP2, the contacting area between the first main bonding layer 111 and the second main bonding layer 211 is reduced, accordingly. Therefore, defects such as metal dishing, which easily occur after planarization of large area of a conductive feature, may be significant reduced.

With reference to FIG. 11, the first opening OP1 and the second opening OP2 may connect to each other after bonding. The first opening OP1 and the second opening OP2 together configure the first space SP1 which is enclosed by the first substrate 101, the first circuit layer 103, the second substrate 201, and the second circuit layer 203. In some embodiments, due to the different dimensions of the first opening OP1 and the second opening OP2, step profiles may occur at the interface between the second opening OP2 and the second main bonding layer 211 (as shown in dashed circles in FIG. 11).

Figure 12:
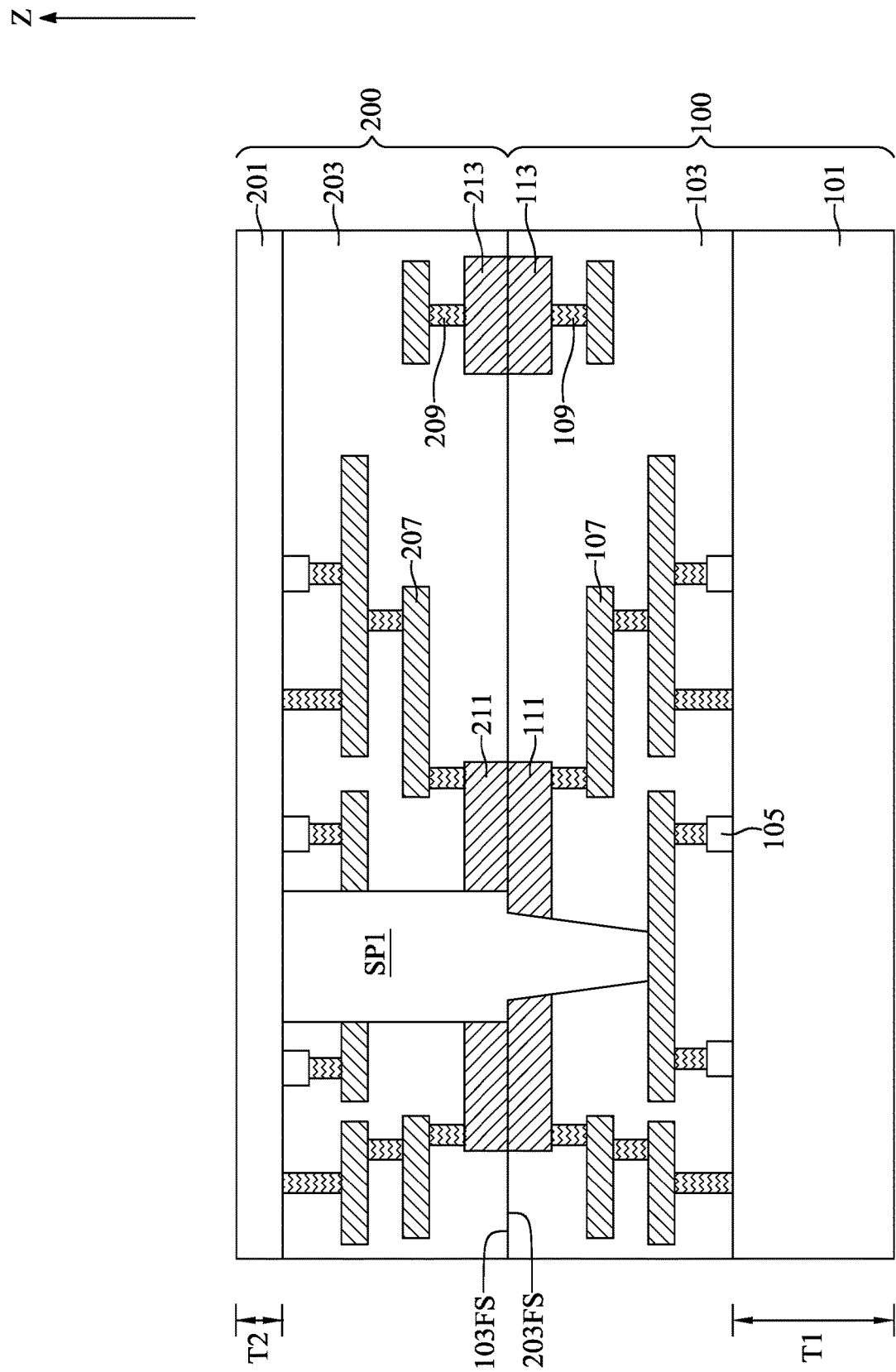

With reference to FIG. 12, a thinning process may be performed to reduce a thickness of the second substrate 201 so as to reduce the height of the semiconductor device 1A. After the thinning process, the thickness T1 of the first substrate 101 may be greater than the thickness T2 of the second substrate 201. This thinning process may allow for improved thermal dissipation and provide for a lower device profile, as well as reducing the depth and width required for a through semiconductor via passing through the second substrate 201. Alternatively, in some embodiments, the thinning process for the second substrate 201 may be omitted.

In some embodiments, the second substrate 201 may be thinned to a thickness between about 0.5 μm and about 10 μm. The thinning process may be accomplished, e.g., using mechanical abrasion, polishing, or the like, or using chemical removal, such as a wet etch. A thinning-stop layer (not shown) may be implanted in substrate fir thinning stop control. The thinning stop layer may be a dopant layer or an epitaxially grown layer having a thickness of about 0.2 μm to about 10 μm. The thickness of the thinning stop layer may be selected so that it is sufficiently thick to stop the thinning process depending on the employed etching selectivity. For example, if the used etching selectivity is about 1:100, the thinning stop layer may have a thickness between about 0.2 μm and about 5 μm. Other dimensions may be used for the thinning stop layer based on process configuration.

An advantageous, but not limiting, feature of the illustrated embodiment is that by bonding the first semiconductor structure 100 and the second semiconductor structure 200 prior to thinning, a carrier may not be required to provide wafer support during bonding.

Furthermore, thin wafer handling techniques may not be required because both the first semiconductor structure 100 and the second semiconductor structure 200 are sufficiently thick. The lack of a carrier or thin wafer handling processes may lower manufacturing costs and increase yield.

Figure 13:
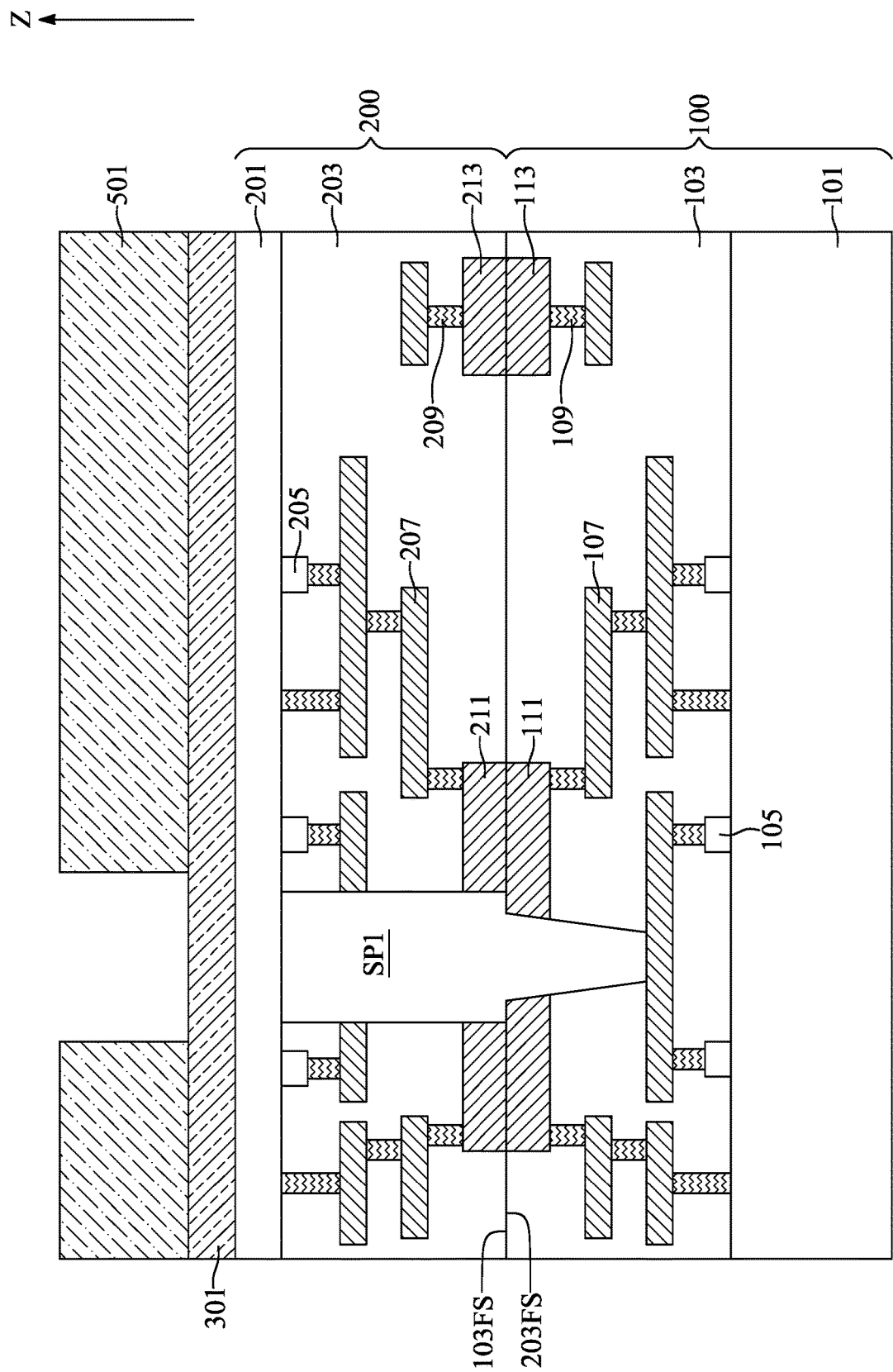
Figure 14:
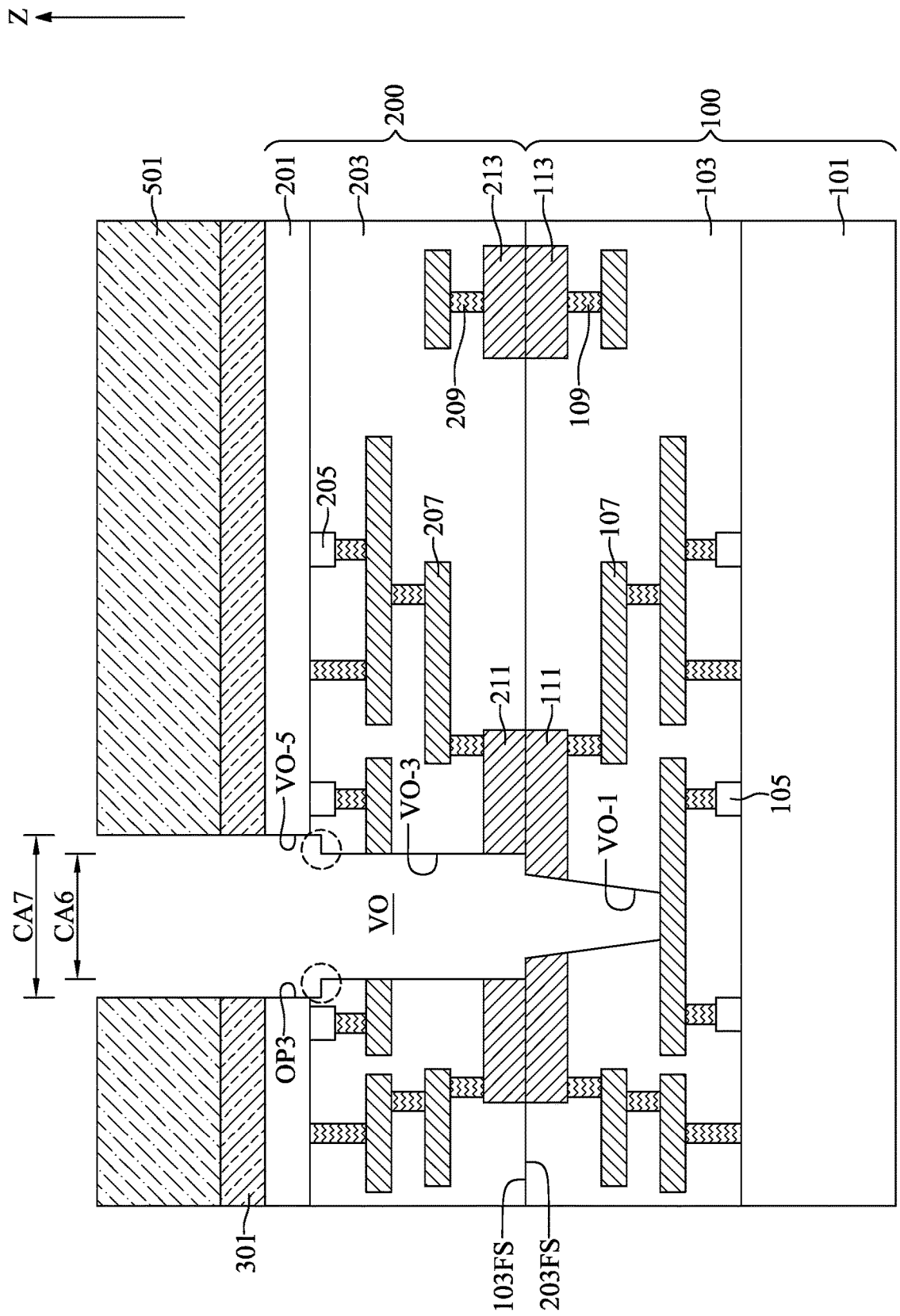

With reference to FIGS. 1, 13, and 14, at step S21, a third opening OP3 may be formed along the second substrate 201 and connected to the first space SP1, wherein the third opening OP3 and the first space SP1 together configure a via opening VO.

With reference to FIG. 13, a passivation layer 301 may be formed on the second substrate 201. In some embodiments, the passivation layer 301 may be formed of, for example, a non-organic material selected from un-doped silicate glass, silicon nitride, silicon oxynitride, silicon oxide, silicon nitride oxide, or a combination thereof. In some embodiments, the passivation layer 301 may be formed of, for example, a polymer layer such as an epoxy, polyimide, benzocyclobutene, polybenzoxazole, or the like. The passivation layer 301 may be formed by a deposition process such as chemical vapor deposition, plasma-enhanced chemical vapor deposition, evaporation, or spin-on coating. A first mask layer 501 may be formed on the passivation layer 301. The first mask layer 501 may be a photoresist layer. The first mask layer 501 may have a pattern of the third opening OP3.

With reference to FIG. 14, an etch process, such as an anisotropic dr etch process, may be performed to remove a portion of the passivation layer 301, a portion of the second substrate 201, and a portion of the second circuit layer 203 to form the third opening OP3. The third opening OP3 may connect to the first space SP1. The third opening OP3 and the first space SP1 together configure the via opening VO. The via opening VO may include a lower portion VO-1, a middle portion VO-3, and an upper portion VO-5. The lower portion VO-1, the middle portion VO-3, and the upper portion VO-5 may be turned from the first opening OP1, the second opening OP2, and the third opening OP3, respectively. That is, the dimensions of the lower portion VO-1, the middle portion VO-3, and the upper portion VO-5 may be inherited from the first opening ON, the second opening OP2, and the third opening OP3, respectively. Accordingly, ratios between horizontal cross-sectional areas of the lower portion VO-1 or the middle portion VO-3 and horizontal cross-sectional areas of the first substrate 101, the first main bonding layer 111, the second substrate 201, and the second main bonding layer 211 may be the same as that illustrated for the first opening OP1 and the second opening OP2, and descriptions thereof are not repeated herein.

In some embodiments, the horizontal cross-sectional area CA7 of the upper portion VO-5 (i.e., the third opening OP3) may be greater than the horizontal cross-sectional area CA6 of the middle portion VO-3 (i.e., the second opening OP2). Step profiles may be occurred adjacent to the interface between the sidewall of the middle portion VO-3 and the sidewall of the upper portion VO-5.

Comparing to that directly forming a via opening along the passivation layer 301 and the second semiconductor structure 200 and extending to the first circuit layer 103, the via opening VO configured by aligning the first space SN and the third opening OP3 may be more suitable to form a via opening with greater dimension. Accordingly, a through semiconductor via formed in the via opening with greater dimension may have a lower series resistance which is suitable for designated as a power line.

Figure 15:
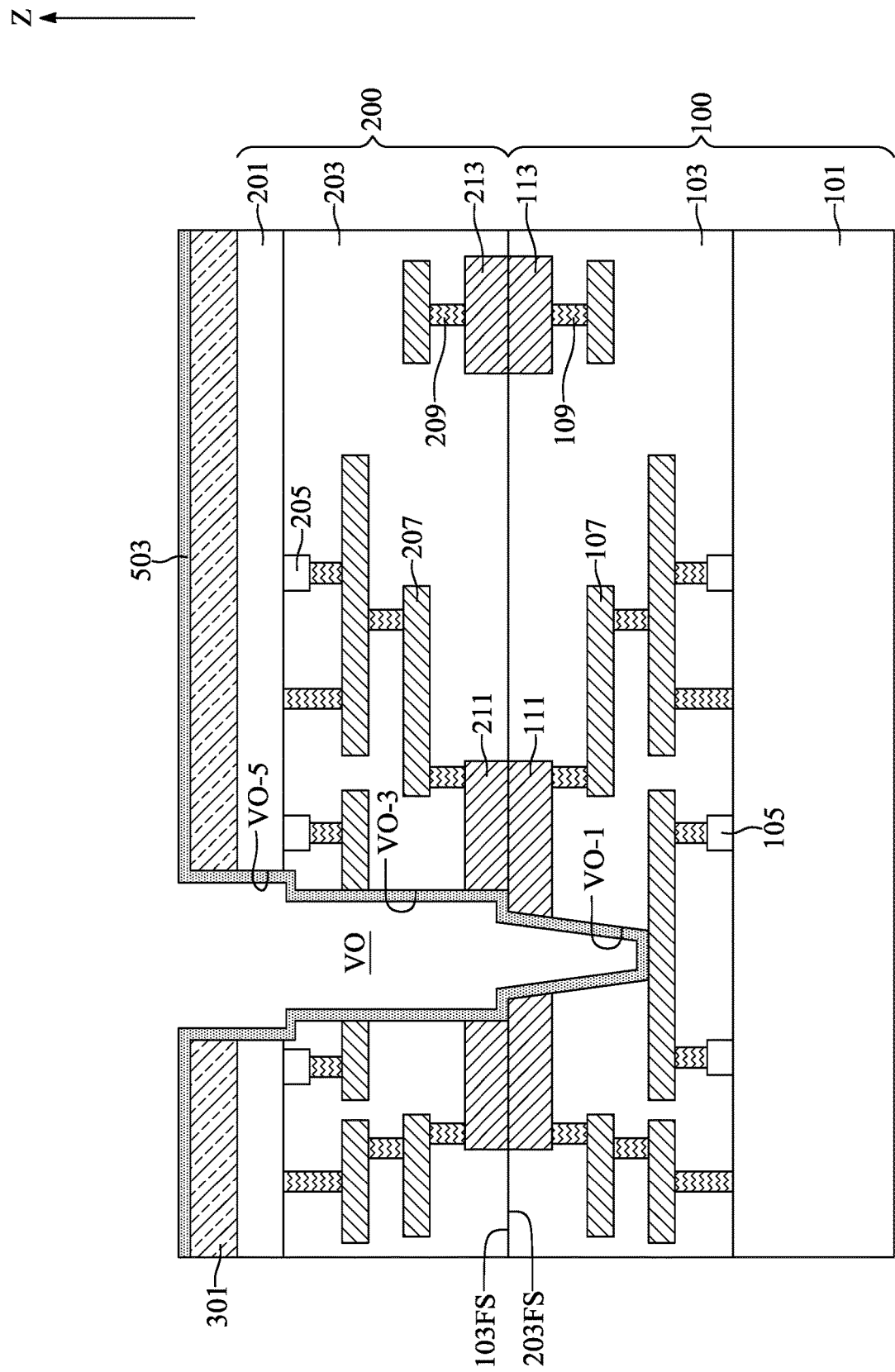
Figure 16:
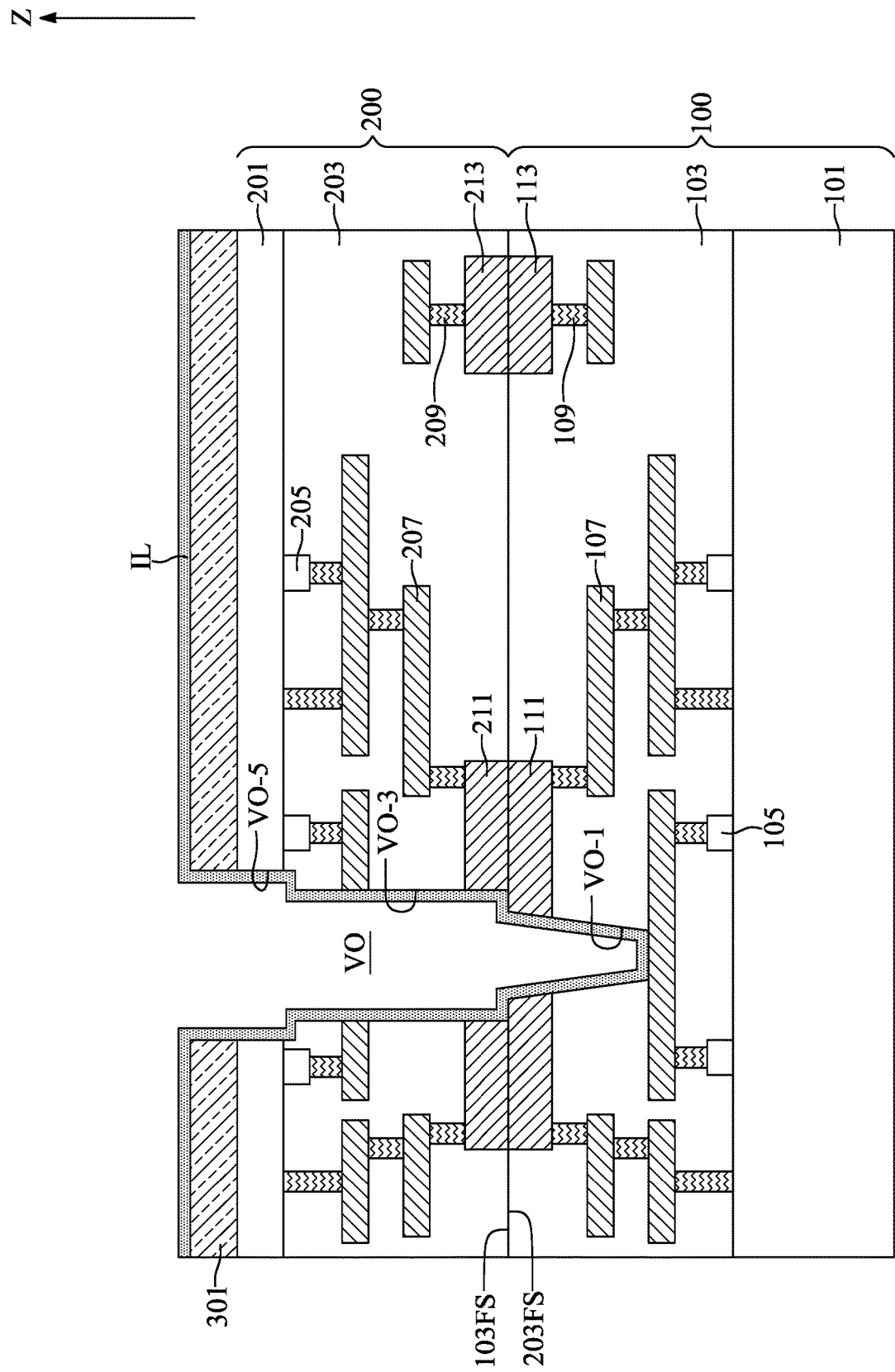

With reference to FIGS. 1, 15, and 16, at step S23, an insulation layer IL may be conformally formed in the via opening VO.

With reference to FIG. 15, the first mask layer 501 may be removed after formation of the via Opening VO. A layer of insulation material 503 may be conformally formed on the sidewall and the bottom surface of the via opening VO and on the passivation layer 301. In some embodiments, the insulation material 503 may be, for example, silicon oxide, silicon nitride, silicon oxynitride, or tetra-ethyl ortho-silicate. The layer of insulation material 503 may have a thickness between about 50 µm and about 200 nm. Alternatively, in some embodiments, the insulation material 503 may be, for example, parylene, epoxy, or polyp-xylene). The layer of insulation material 503 may have a thickness between about 1 µm and about 5 µm. The layer of insulation material 503 may ensure a through semiconductor via 401, as will be illustrated later, is electrically isolated from the first main bonding layer 111 and the second main bonding layer 211.

With reference to FIG. 16, a punch etch process may be performed to remove the layer of insulation material 503 formed on the bottom surface of the via opening VO. After the punch etch process, the layer of insulation material 503 may be turned into the insulation layer IL. In some embodiments, the layer of insulation material 503 thrilled on the passivation layer 301 may be removed during the punch etch process.

With reference to FIG. 1 and FIGS. 17 to 19, at step S25, a through semiconductor via 401 may be thrilled in the via opening VO and a connector 303 may be formed on the through semiconductor via 401.

Figure 17:
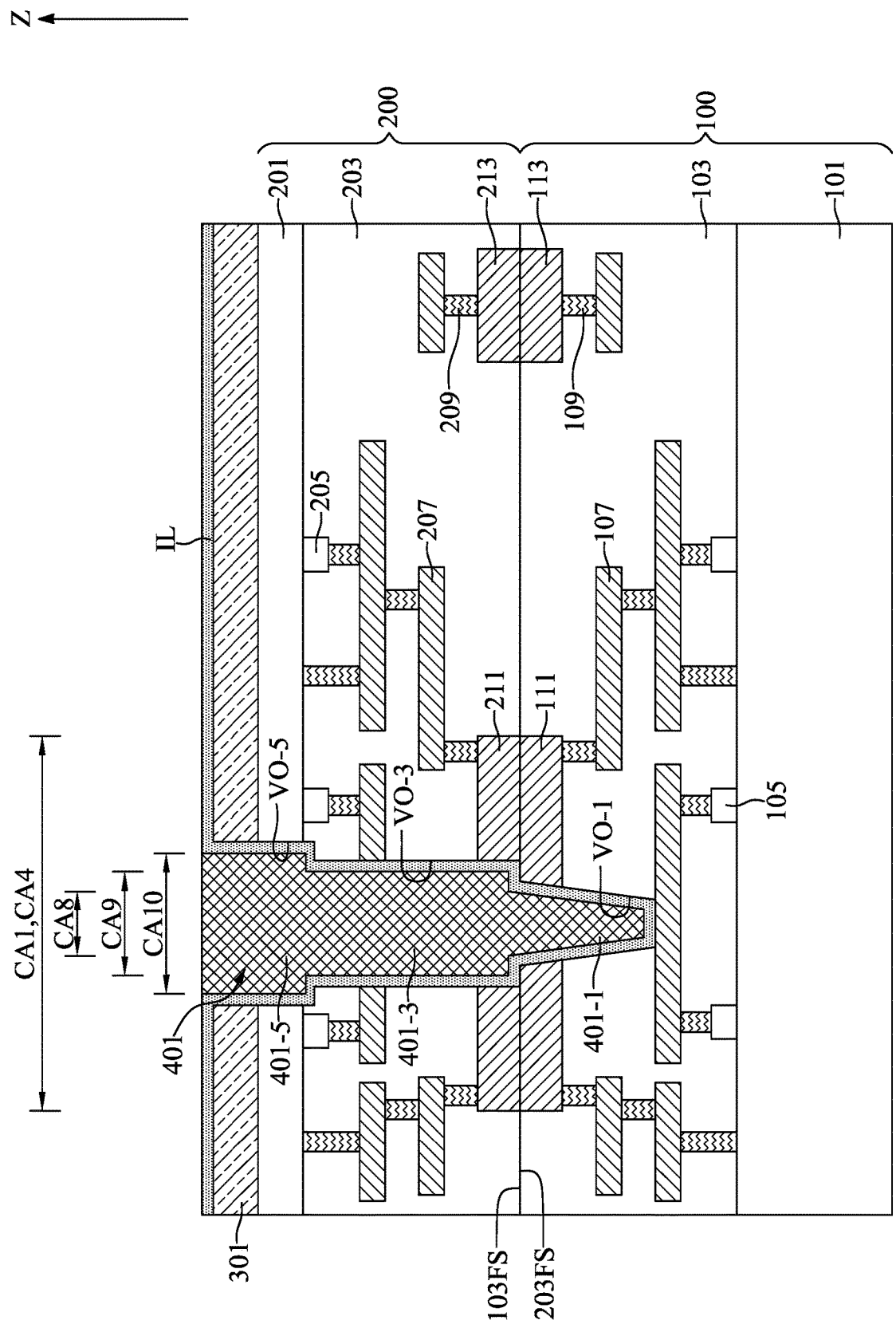

With reference to FIG. 17, a conductive material may be deposited to completely fill the via opening VO. A planarization process, such as chemical mechanical polishing, may be performed to remove excess material, provide a substantially flat surface for subsequent processing steps, and concurrently form the through semiconductor via 401. The through semiconductor via 401 may include a lower segment 401-1 formed ire the lower portion VO-1, a middle segment 401-3 formed in the middle portion VO-3, and an upper segment 401-5 formed in the upper portion VO-5. The dimensions of the lower segment 401-1, the middle segment 401-3, and the upper segment 401-5 are inherited from the lower portion VO-1, the middle portion VO-3, and the upper portion VO-5 of the via opening VO, respectively.

In some embodiments, a ratio of the horizontal cross-sectional area CA8 of the lower segment 401-1 and the horizontal cross-sectional area CA1 of the first main bonding layer 111 may be between about 20% and about 60%. In some embodiments, a ratio of the horizontal cross-sectional area CA8 of the lower segment 401-1 and the horizontal cross-sectional area of the first substrate 101 may be between about 1% and about 9%. In some embodiments, a ratio of the horizontal cross-sectional area CA9 of the middle segment 401-3 and the horizontal cross-sectional area CA1 of the first main bonding layer 111 may be between about 30% and about 70%. In some embodiments, a ratio of the horizontal cross-sectional area CA9 of the middle segment 401-3 and the horizontal cross-sectional area of the second substrate 201 may be between about 2% and about 10%. In some embodiments, the horizontal cross-sectional area CA10 of the upper segment 401-5 may be greater than the horizontal cross-sectional area CA9 of the middle segment 401-3.

The through semiconductor via 401 is formed within the region of the first main bonding layer 111 and the second main bonding layer 211; therefore, no extra wafer space is needed to separate the through semiconductor via 401 and the first main bonding layer 111 or the second main bonding layer 211 to reduce effects of misalignment during photolithography process. As a result, the real estate of the semiconductor device 1A may be saved. In some embodiments, the through semiconductor via 401 may be electrically coupled to an external power source so as to be designated as a power line of the semiconductor device 1A.

Figure 18:
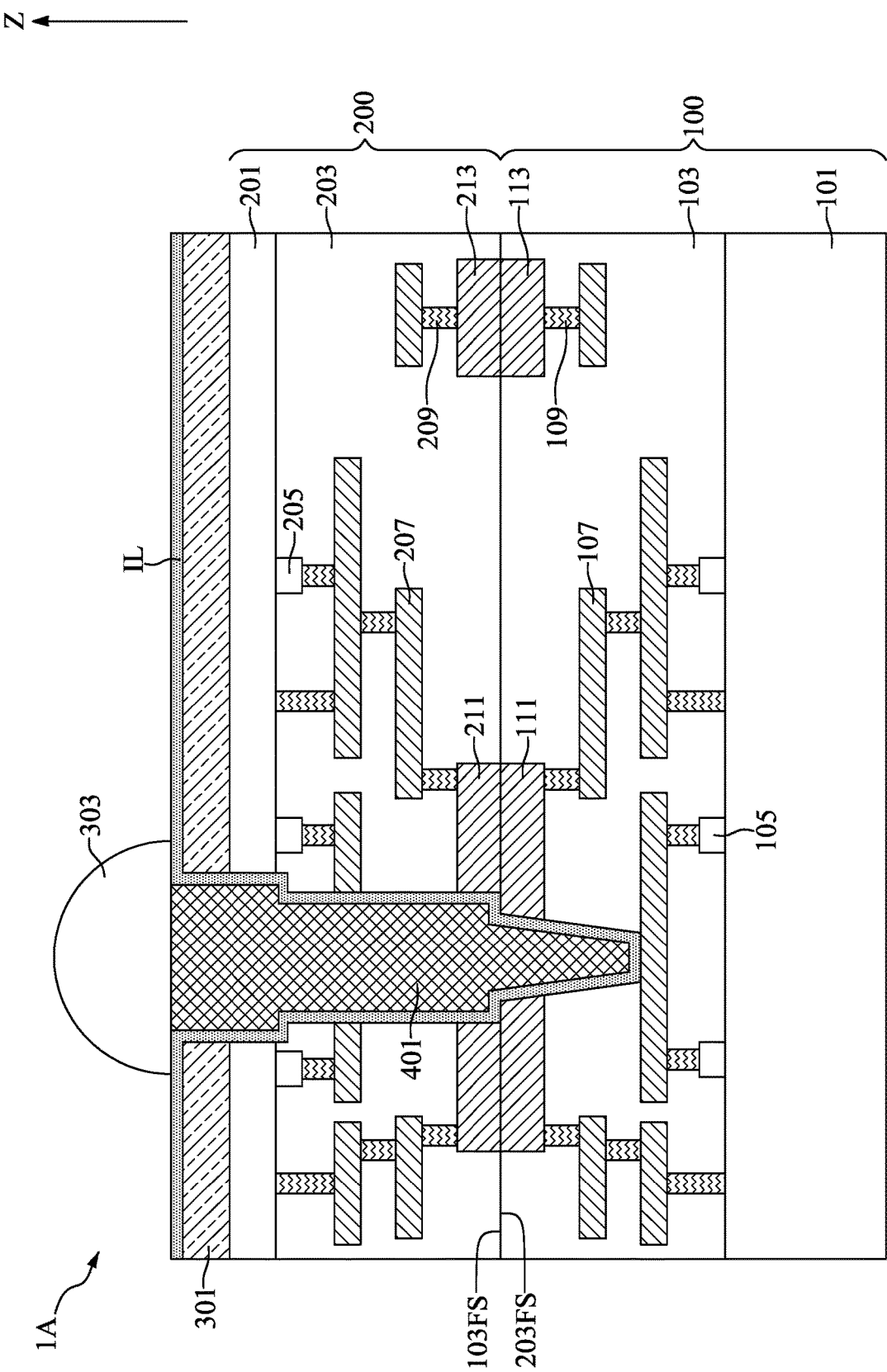
Figure 19:
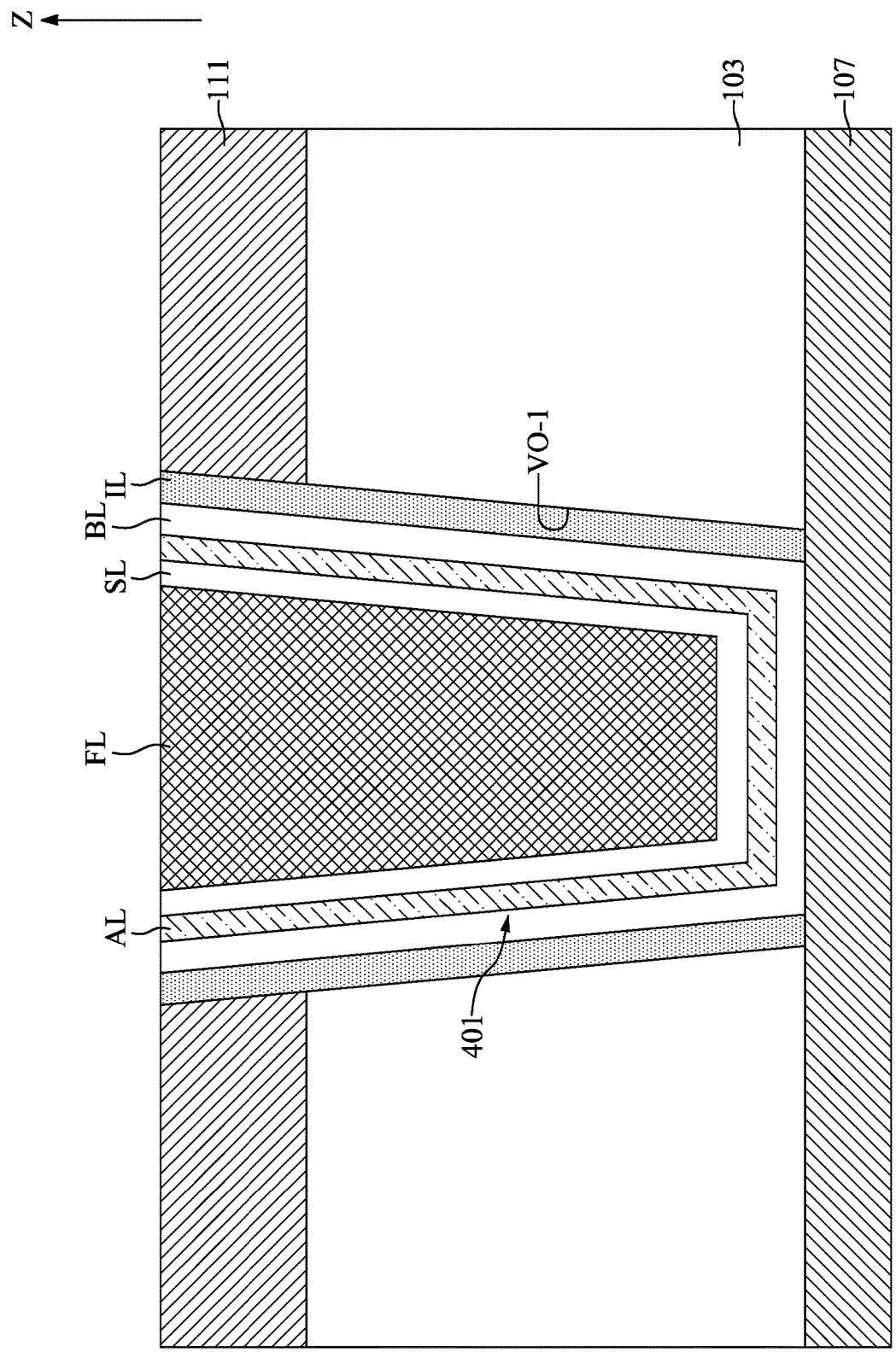
FIG. 19 illustrates, in a schematic close-up cross-sectional view diagram, an intermediate semiconductor device in accordance with one embodiment of the present disclosure.

With reference to FIG. 18, the connector 303 may include a conductive material with low resistivity, such as tin, lead, silver, copper, nickel, bismuth or an alloy thereof, and may be formed by a suitable process such as evaporation, plating, ball drop, or screen printing. In some embodiments, the connector 303 may be a controlled collapse chip connection (i.e., C4) bump formed by a C4 process. In some embodiments, the connector 303 may be a solder joint. The solder joint may comprise a material such as tin, or other suitable materials, such as silver or copper. In an embodiment in which the solder joint is tin solder joint, the solder joint may be formed by initially forming a layer of tin through evaporation, electroplating, printing, solder transfer, or ball placement to a thickness of about 10 µm to about 100 µm. Once the layer of tin has been formed on the through semiconductor via 401, a reflow process may be performed to shape the solder joint into the desired shape. In some embodiments, the connector 303 may be a pillar bump formed of, for example, copper.

With reference to FIG. 19, in some embodiments, the through semiconductor via 401 may include a filler layer FL, a seed layer SL, an adhesive layer AL, and a barrier layer BL. For clarity, the aforementioned layers formed in the middle portion VO-3 and the upper portion VO-5 are not shown in FIG. 19.

The barrier layer BL may be conformally formed on the insulation layer IL and on the bottom surface of the via opening VO, and contacting the top surface of the corresponding first conductive line 107. The barrier layer BL may be formed of, for example, tantalum, tantalum nitride, titanium, titanium nitride, rhenium, nickel boride, or tantalum nitride/tantalum bilayer.

The adhesive layer AL may be conformally formed on the barrier layer BL. The adhesive layer AL may be thrilled of, for example, titanium, tantalum, titanium tungsten, or manganese nitride. The adhesive layer AL may improve an adhesion between the seed layer SL and the barrier layer BL. The adhesive layer AL may have a thickness between about 5 nm and about 50 nm.

The seed layer SL may be conformally formed on the adhesive layer AL. The seed layer SL may have a thickness between about 10 µm and about 40 nm. The seed layer SL may be formed of, for example, copper or ruthenium. The seed layer SL may reduce the resistivity of the via opening VO during the formation of the filler layer FL by an electroplating process.

The filler layer FL may be formed on the seed layer SL and completely fill the via opening VO. The filler layer FL may be, for example, copper. The filler layer FL may be formed by an electroplating process.

FIGS. 20 to 25 illustrate, in schematic cross-sectional view diagrams, a flow for fabricating a semiconductor device 1B in accordance with another embodiment of the present disclosure.

Figure 20:
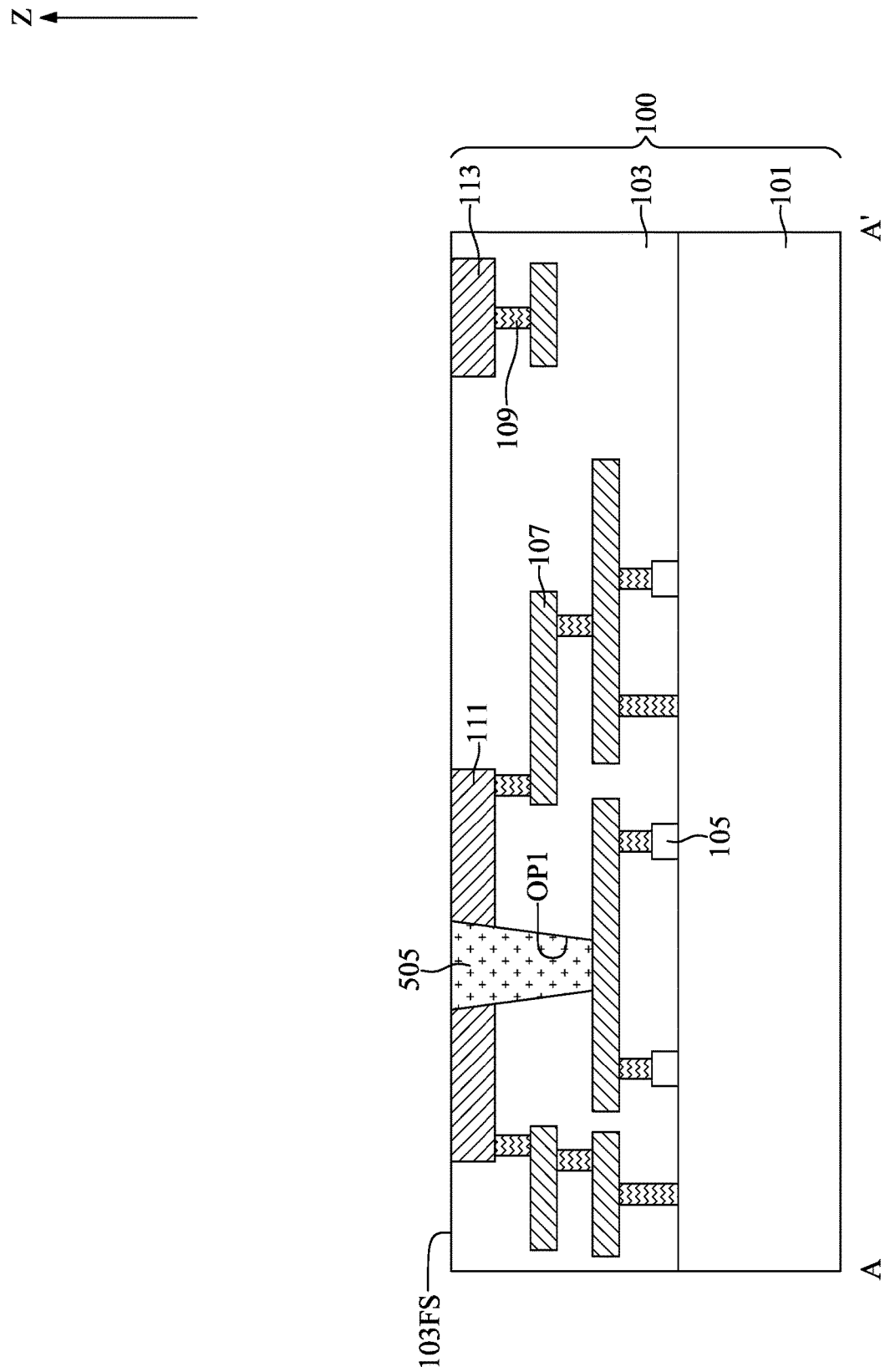
FIGS. 20 to 25 illustrate, in schematic cross-sectional view diagrams, a flow for fabricating a semiconductor device in accordance with another embodiment of the present disclosure.

With reference to FIG. 20, an intermediate semiconductor device may be fabricated with a procedure similar to that illustrated in FIGS. 2 to 5. A first energy removable layer 505 may be formed to completely fill the first opening OP1. The first energy removable layer 505 may include a material such as a thermal decomposable material, a photonic decomposable material, an e-beam decomposable material, or a combination thereof. The first energy removable layer 505 may be decomposed by exposing to an energy source. The energy source may include heat, light, or a combination thereof. When heat is used as the energy source, a temperature may be set between about 800° C. and about 900° C. When light is used as the energy source, an ultraviolet light or an e-beam may be applied.

Figure 21:
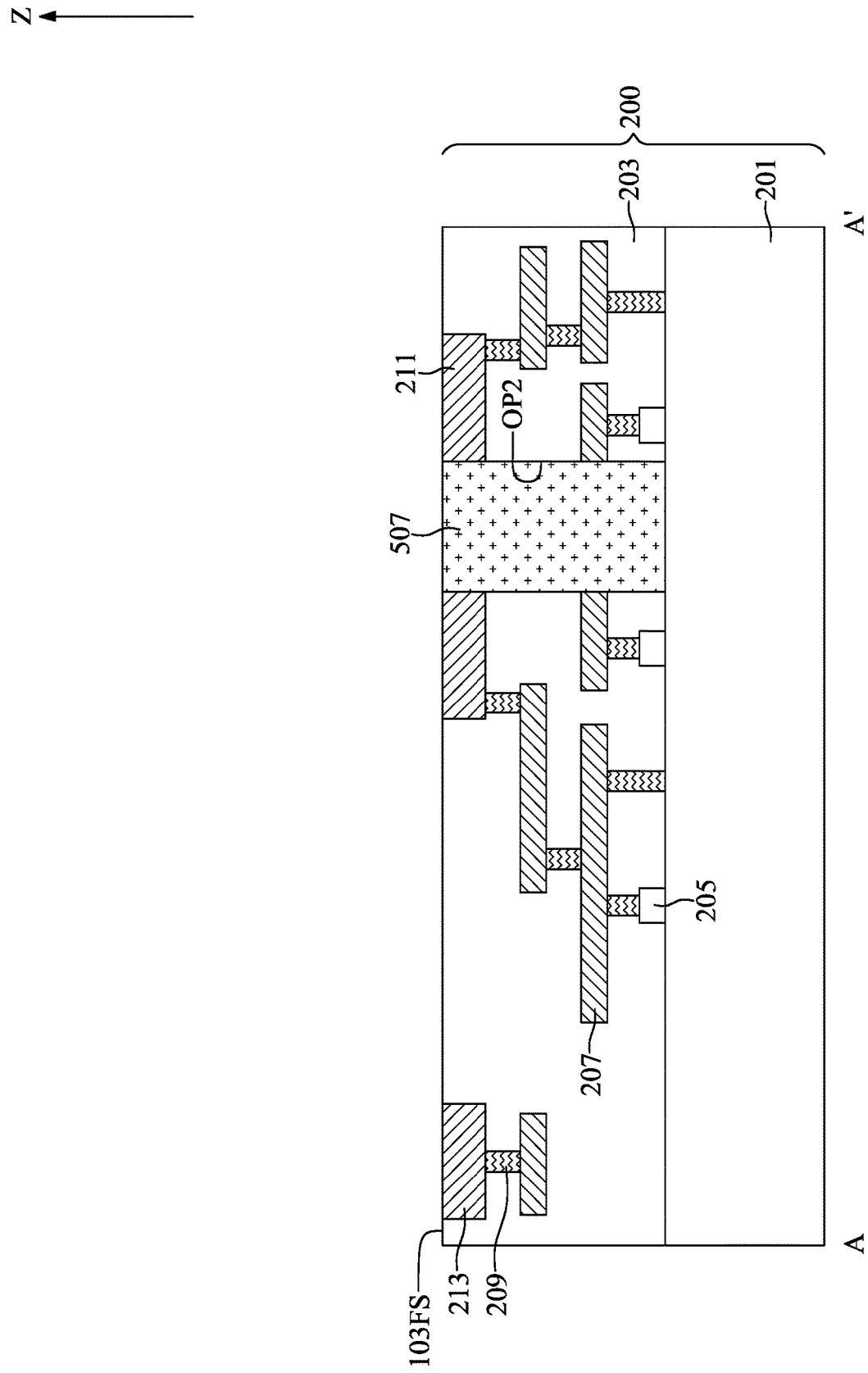

With reference to FIG. 21, an intermediate semiconductor device may be fabricated with a procedure similar to that illustrated in FIGS. 6 to 9. A second energy removable layer 507 may be formed to completely fill the second opening OP2. The second energy removable layer 507 may include a same material as the first energy removable layer 505.

Figure 22:
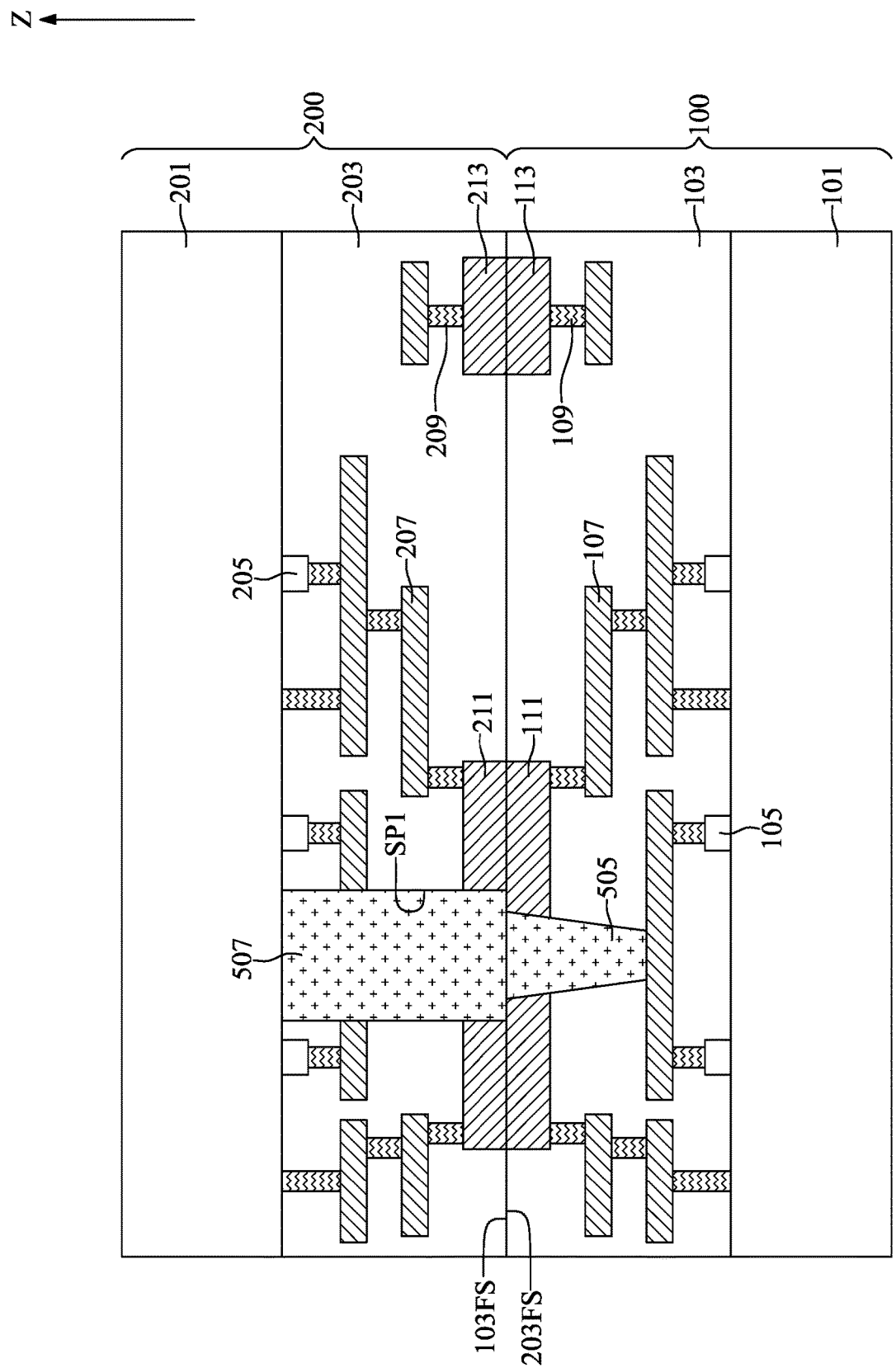

With reference to FIG. 22, a hybrid bonding process similar to that illustrated in FIGS. 10 and 11 may be performed. The hybrid bonding process may further include polymer-to-polymer bonding and polymer-to-metal bonding which may further improve the bonding quality between the first semiconductor structure 100 and the second semiconductor structure 200. The polymer-to-polymer bonding may originate from the bonding between the first energy removable layer 505 and the second energy removable layer 507. The polymer-to-metal bonding may originate from the bonding between the second energy removable layer 507 and the first main bonding layer 111.

Figure 23:
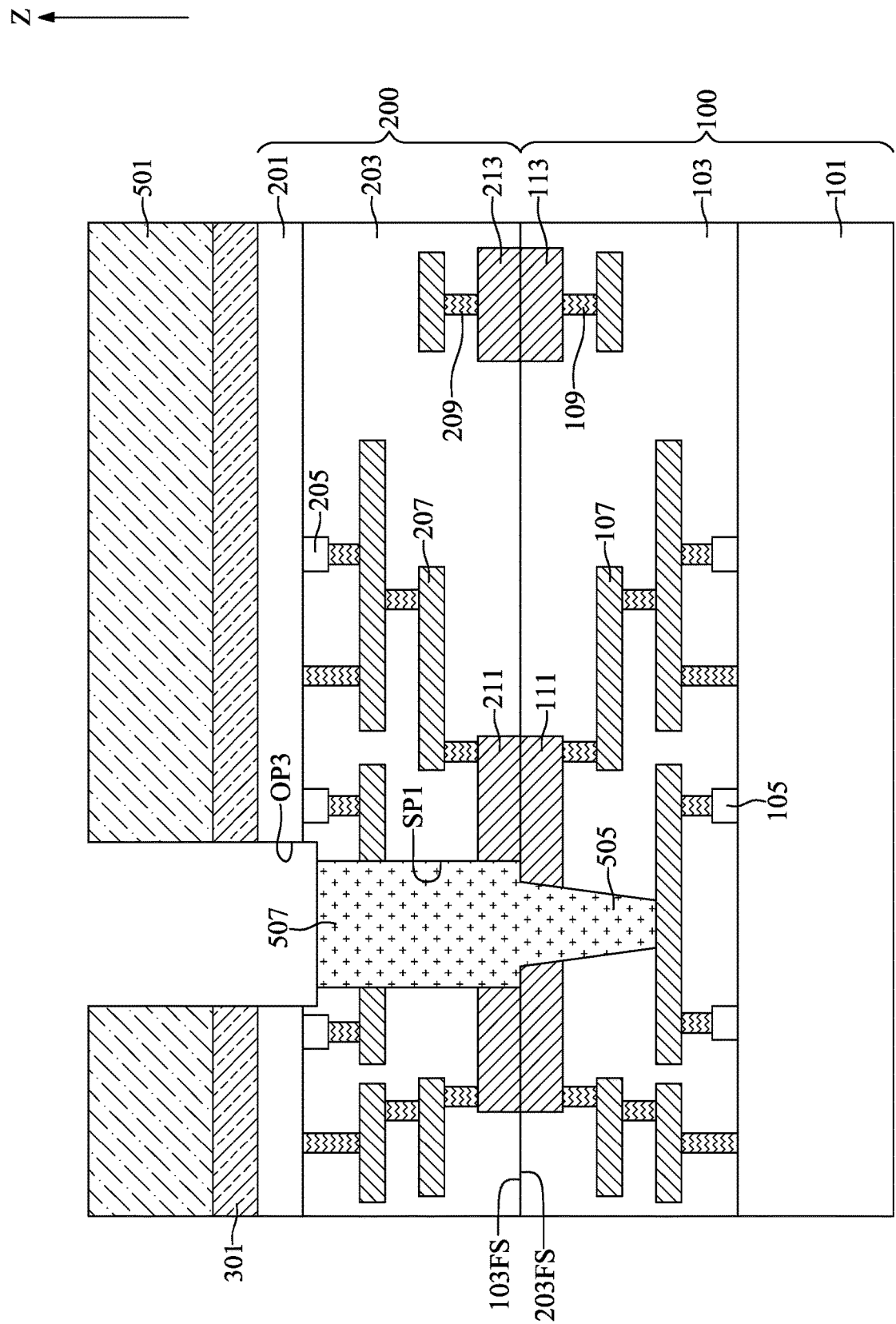

With reference to FIG. 23, the third opening OP3 may be formed with a procedure similar to that illustrated in FIGS. 13 and 14 to expose the second energy removable layer 507.

Figure 24:
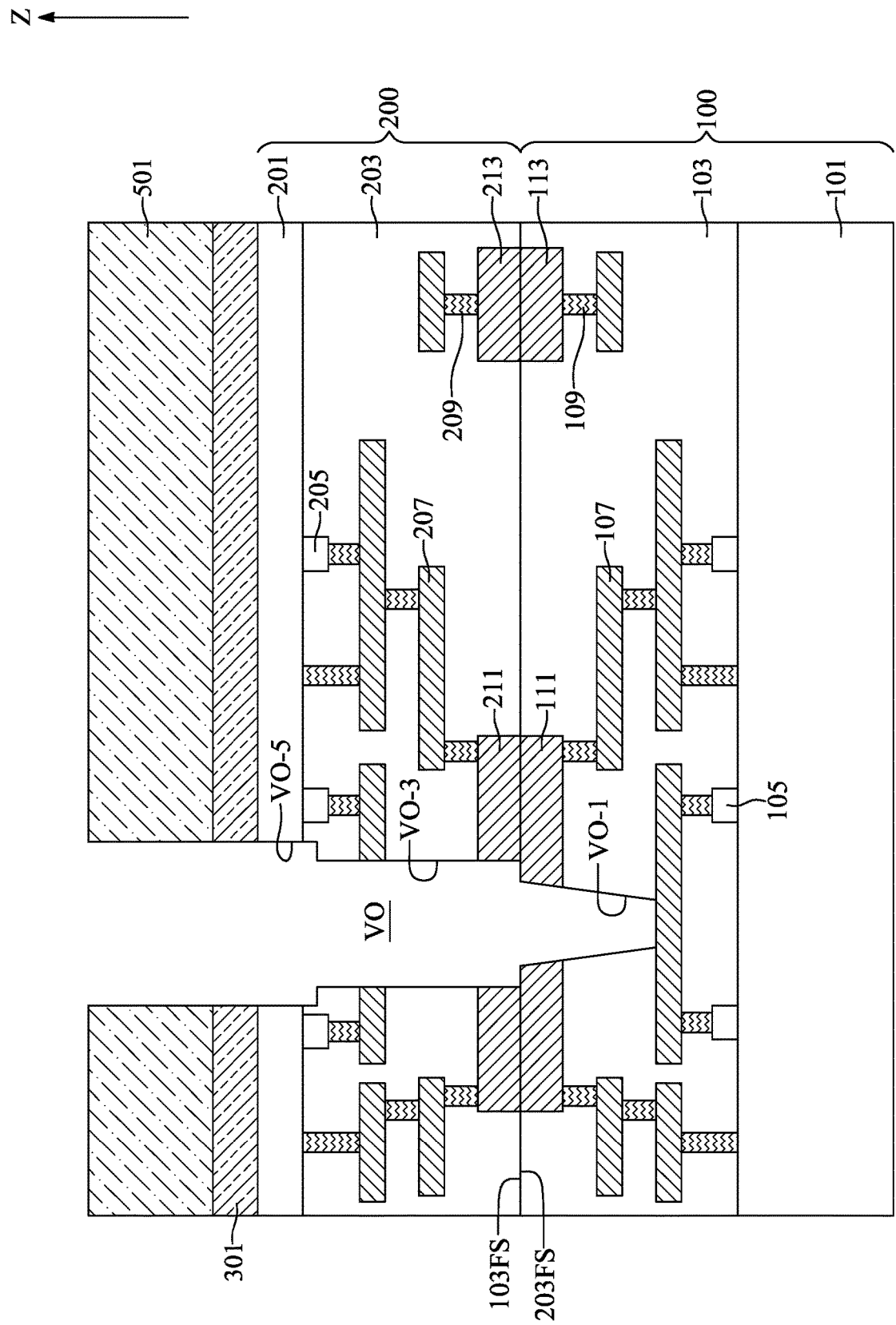

With reference to FIG. 24, an energy treatment may be performed by exposing the intermediate semiconductor device illustrated in FIG. 23 to an energy source such as heat or light. The first energy removable layer 505 and the second energy removable layer 507 may be removed after the energy treatment and the via opening VO may be concurrently formed in the place where the first energy removable layer 505 and the second energy removable layer 507 previous occupied.

Figure 25:
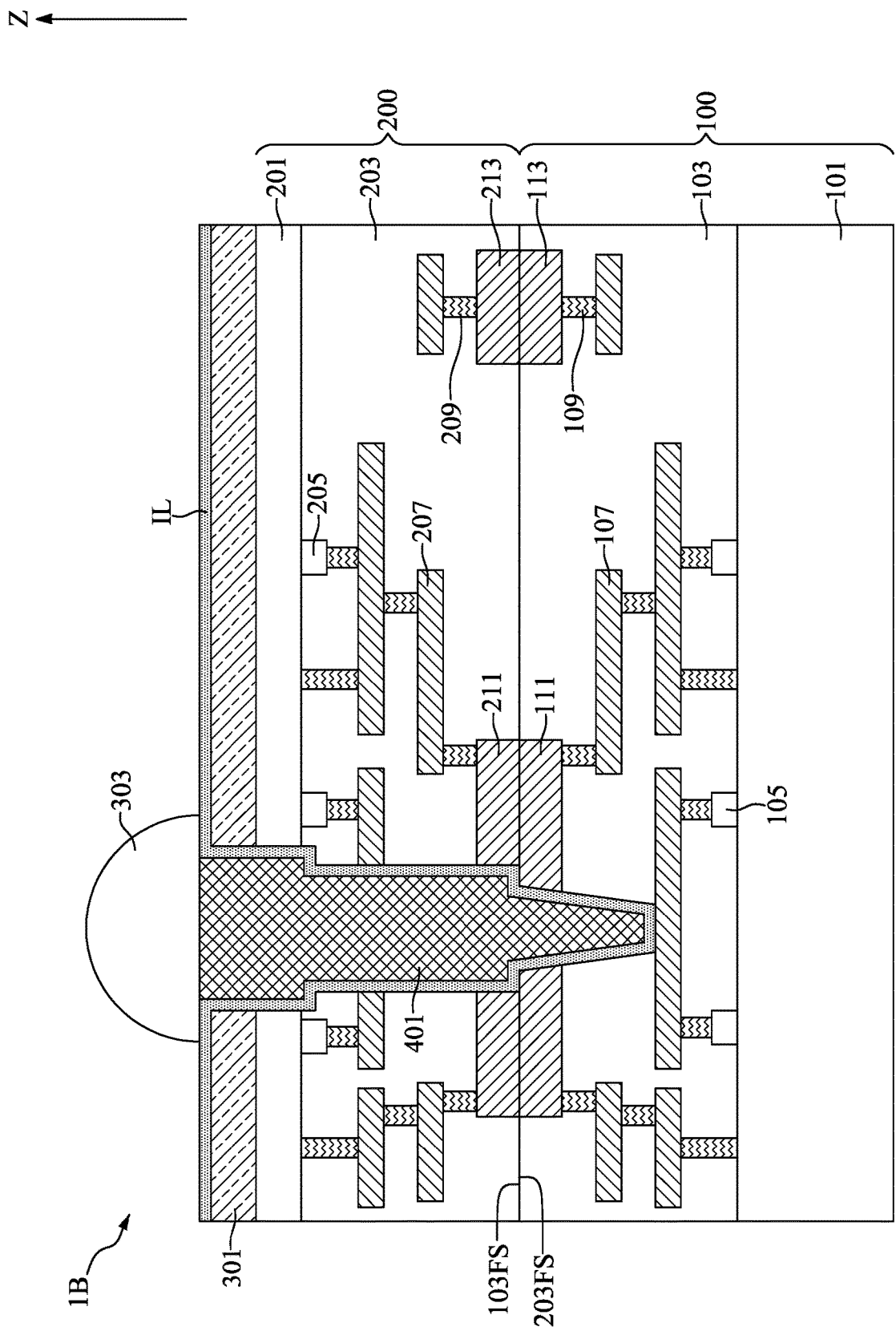

With reference to FIG. 25, the insulation layer IL, the through semiconductor via 401, and the connector 303 may be sequentially formed with a procedure similar to that illustrated in FIGS. 15 to 18.

Figure 26:
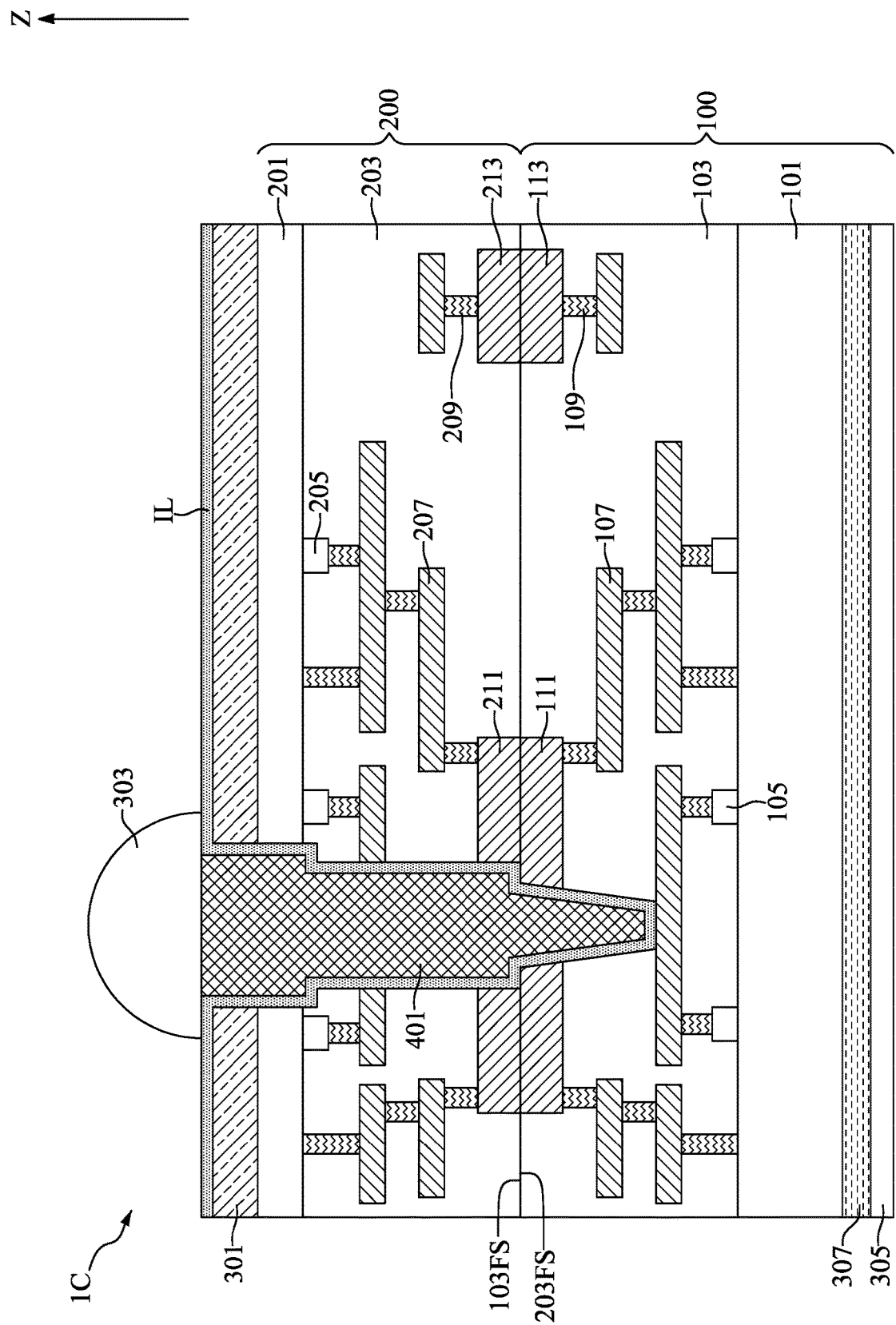
FIG. 26 illustrates, in a schematic cross-sectional view diagram, a semiconductor device in accordance with another embodiment of the present disclosure.

FIG. 26 illustrates, in a schematic cross-sectional view diagram, a semiconductor device 1C in accordance with another embodiment of the present disclosure.

With reference to FIG. 26, the semiconductor device 1C may have a structure similar to that illustrated in FIG. 18. The same or similar elements in FIG. 26 as in FIG. 18 have been marked with similar reference numbers and duplicative descriptions have been omitted. The semiconductor device 1C, may include a thermal dissipation layer 305 and an attachment layer 307.

With reference to FIG. 26, the thermal dissipation layer 305 may be disposed below the first substrate 101. The attachment layer 307 may be used to attach the thermal dissipation layer 305 to the first substrate 101, In some embodiments, the attachment layer 307 may include a die attach film, silver paste, or the like. In some embodiments, the thermal dissipation layer 305 may be formed of, for example, a composite material selected from the group consisting of silicon carbide, aluminum nitride, graphite, and the like. The thermal dissipation layer 305 may have a good thermal conductivity, which may be greater than about 2 W/m·K. In some embodiments, the thermal dissipation layer 305 may have high thermal conductivity greater than about 100 W/m·K, and may be formed using a metal, a metal alloy, or the like. For example, the thermal dissipation layer 305 may comprise metals and/or metal alloys selected from the group consisting of aluminum, copper, nickel, cobalt, and the like.

In some embodiments, the thermal dissipation layer 305 may be formed of a carbon material that is imbued with a flexible material such as a polymer matrix. For example, the thermal dissipation layer 305 may include generally vertically oriented graphite and carbon nanotubes, which are imbued with a fluoropolymer rubber matrix. The aspect ratio of the carbon nanotubes may be between about 1:1 and about 1:100. For another example, the thermal dissipation layer 305 may include graphitic carbon. For yet another example, the thermal dissipation layer 305 may include pyrolytic graphite sheet. In some embodiments, a thermal resistance of the thermal dissipation layer 305 may be less than 0.2° C. cm2/Watt at a thickness between about 250 μm and about 450 μm. The thermal dissipation layer 305 may provide additional thermal dissipation capability to the semiconductor device 1C.

One aspect of the present disclosure provides a semiconductor device including a first semiconductor structure, a second semiconductor structure, through semiconductor via, and an insulation layer. The first semiconductor structure includes a first circuit layer positioned on a first substrate, and a first main bonding layer positioned in the first circuit layer. The first main bonding layer is substantially coplanar with a front face of the first circuit layer. The second semiconductor structure includes a second circuit layer positioned on the first circuit layer, a second substrate, and a second main bonding layer. The second substrate is positioned on the second circuit layer. The second main bonding layer is positioned in the second circuit layer. The second main bonding layer and the first main bonding layer are topologically aligned and contacted to each other. The through semiconductor via is positioned along the second semiconductor structure and the first main bonding layer, extending to the first circuit layer, and physically and electrically coupled to a corresponding conductive line in the first circuit layer. The insulation layer is positioned between the second semiconductor structure and the through semiconductor via, between the first main bonding layer and the through semiconductor via, and between the first circuit layer and the through semiconductor via.

Another aspect of the present disclosure provides a method for fabricating a semiconductor device including providing a first semiconductor structure, forming a first opening, providing a second semiconductor structure, forming a second opening, flipping the second semiconductor structure, bonding the second circuit layer onto the first circuit layer, forming a via opening, conformally forming an insulation layer on a sidewall of the via opening, and thrilling a through semiconductor via in the via opening. The first semiconductor structure includes a first circuit layer on a first substrate, and a first main bonding layer in the first circuit layer. The first opening is formed to expose at least partially a corresponding first conductive line in the first circuit layer. The second semiconductor structure includes a second circuit layer on a second substrate, and a second main bonding layer in the second circuit layer. The second opening is formed to expose at least partially the second substrate. The first circuit layer and the second circuit layer are bonded through a hybrid bonding. The first main bonding layer and the second main bonding layer are topologically aligned and physically contacted to each other. The first opening and the second opening are topologically aligned and connected to each other to configure a first space. The via opening is configured by a third opening formed along the second substrate and the first space.

Due to the design of the semiconductor device of the present disclosure, the through semiconductor via 401 with low series resistance may be provided. Therefore, the performance of the semiconductor device 1A may be improved. In addition, the first opening OP1 and the second opening OP2 may reduce the occurrence of defects such as metal dishing. As a result, the yield and quality of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a first semiconductor structure comprising a first circuit layer positioned on a first substrate, and a first main bonding layer positioned in the first circuit layer, wherein a top surface of the first main bonding layer is substantially coplanar with a front face of the first circuit layer;
    a second semiconductor structure comprising a second circuit layer positioned on the first circuit layer, a second substrate positioned on the second circuit layer, and a second main bonding layer positioned in the second circuit layer, and aligned with and contacted to the first main bonding layer;
    a through semiconductor via positioned in the second semiconductor structure and the first main bonding layer, extending to the first circuit layer, and physically and electrically coupled to a corresponding conductive line in the first circuit layer; and
    an insulation layer conformally formed on a sidewall of the through semiconductor via, the insulation layer positioned between the second semiconductor structure and the through semiconductor via, between the first main bonding layer and the through semiconductor via, and between the first circuit layer and the through semiconductor via;
    wherein the insulation layer includes an opening to expose at least partially the corresponding conductive line in the first circuit layer.

2. The semiconductor device of claim 1, wherein a horizontal cross-sectional area of the through semiconductor via positioned in the second semiconductor structure is greater than a horizontal cross-sectional area of the through semiconductor via positioned in the first main bonding layer.

3. The semiconductor device of claim 2, wherein a horizontal cross-sectional area of the through semiconductor via positioned in the second substrate is greater than a horizontal cross-sectional area of the through semiconductor via positioned in the second main bonding layer.

4. The semiconductor device of claim 2, further comprising a first sub-bonding layer and a second sub-bonding layer;
    wherein the first sub-bonding layer is positioned in the first circuit layer and a top surface of the first sub-bonding layer is substantially coplanar with the front face of the first circuit layer, and the second sub-bonding layer is positioned in the second circuit layer and a bottom surface of the second sub-bonding layer is substantially coplanar with the front face of the first circuit layer; wherein the first sub-bonding layer and the second sub-bonding layer are aligned and contacted to each other.

5. The semiconductor device of claim 4, wherein a horizontal cross-sectional area of the first sub-bonding layer is less than a horizontal cross-sectional area of the first main bonding layer and a horizontal cross-sectional area of the second sub-bonding layer is less than a horizontal cross-sectional area of the second main bonding layer.

6. The semiconductor device of claim 2, wherein a sidewall of the through semiconductor via positioned in the first main bonding layer is tapered.

7. The semiconductor device of claim 2, wherein a ratio between the horizontal cross-sectional area of the through semiconductor via positioned in the second semiconductor structure and a horizontal cross-sectional area of the second substrate is between about 2% and about 10%.

8. The semiconductor device of claim 2, wherein a ratio between the horizontal cross-sectional area of the through semiconductor via positioned in the second semiconductor structure and a horizontal cross-sectional area of the second main bonding layer is between about 30% and about 70%.

9. The semiconductor device of claim 2, wherein the through semiconductor via is electrically coupled to an external power source.

10. The semiconductor device of claim 2, further comprising a connector positioned on the through semiconductor via.

11. The semiconductor device of claim 8, wherein a layout of the first circuit layer is different from a layout of the second circuit layer.

12. The semiconductor device of claim 11, wherein the layout of the first circuit layer and the layout of the second circuit layer are symmetrical.

13. The semiconductor device of claim 2, wherein a thickness of the first substrate is greater than or equal to a thickness of the second substrate.

14. The semiconductor device of claim 2, further comprising a thermal dissipation layer positioned below the first substrate, wherein the thermal dissipation layer comprises vertically oriented graphite and carbon nanotubes.

15. The semiconductor device of claim 14, further comprising an attachment layer positioned between the thermal dissipation layer and the first substrate, wherein the attachment layer comprises die attach film, silver paste, or the like.

16. A method for fabricating a semiconductor device, comprising:
    providing a first semiconductor structure comprising a first circuit layer on a first substrate, and a first main bonding layer in the first circuit layer; forming a first opening to expose at least partially a corresponding first conductive line in the first circuit layer;

providing a second semiconductor structure comprising a second circuit layer on a second substrate, and a second main bonding layer in the second circuit layer; forming a second opening to expose at least partially the second substrate;

flipping the second semiconductor structure and bonding the second circuit layer onto the first circuit layer through a hybrid bonding; wherein the first main bonding layer and the second main bonding layer are aligned and contacted to each other; wherein the first opening and the second opening are aligned and connected to each other to form a first space; and forming a third opening positioned in the second substrate and connected to the first space to form a via opening; conformally forming an insulation layer on a sidewall of the via opening; thereby providing a through semiconductor via in the via opening.

17. The method for fabricating the semiconductor device of claim 16, wherein a horizontal cross-sectional area of the first opening is less than a horizontal cross-sectional area of the second opening.

18. The method for fabricating the semiconductor device of claim 16, wherein a horizontal cross-sectional area of the second main bonding layer is less than a horizontal cross-sectional area of the first main bonding layer after the formation of the first opening and the second opening.

19. The method for fabricating the semiconductor device of claim 16, wherein the step of forming the insulation layer comprises:

conformally forming a layer of insulation material on the sidewall and a bottom surface of the via opening; and removing the layer of insulation material on the bottom surface of the via opening to expose at least partially the corresponding first conductive line.

20. The method for fabricating the semiconductor device of claim 16, further comprising a step of performing a thermal annealing process after the bonding of the second circuit layer onto the first circuit layer, wherein a process temperature of the thermal annealing process is between about 25° C. and about 400° C.

* * * * *